(12) United States Patent
Song et al.

(10) Patent No.: US 12,107,172 B2
(45) Date of Patent: *Oct. 1, 2024

(54) SEMICONDUCTOR DEVICE

(71) Applicant: Samsung Electronics Co., Ltd., Suwon-si (KR)

(72) Inventors: Seungmin Song, Hwaseong-si (KR); Taeyong Kwon, Suwon-si (KR); Jaehyeoung Ma, Seongnam-si (KR); Namhyun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/478,410

(22) Filed: Sep. 29, 2023

(65) Prior Publication Data

US 2024/0030355 A1    Jan. 25, 2024

Related U.S. Application Data

(63) Continuation of application No. 17/370,464, filed on Jul. 8, 2021, now Pat. No. 11,799,036.

(30) Foreign Application Priority Data

Nov. 25, 2020   (KR) .................. 10-2020-0160177

(51) Int. Cl.
*H01L 29/786* (2006.01)
*H01L 21/02* (2006.01)
(Continued)

(52) U.S. Cl.
CPC .... *H01L 29/78696* (2013.01); *H01L 21/0259* (2013.01); *H01L 21/823807* (2013.01);
(Continued)

(58) Field of Classification Search
CPC ........... H01L 29/78696; H01L 21/0259; H01L 21/823807; H01L 21/823814;
(Continued)

(56) References Cited

U.S. PATENT DOCUMENTS 7,402,483 B2   7/2008   Yun et al.
9,514,937 B2   12/2016   Sleight et al.
(Continued)

FOREIGN PATENT DOCUMENTS

KR   2017-0102657 A   9/2017
KR   10-2033579 B1    10/2019
KR   2020-0040164 A    4/2020

OTHER PUBLICATIONS

S. Natarajan, et al., "A 14nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products," IEEE VLSI 2015.

*Primary Examiner* — Tong-Ho Kim
(74) *Attorney, Agent, or Firm* — Harness, Dickey & Pierce, P.L.C.

(57) ABSTRACT

A semiconductor device including a substrate including a division region extending in a first direction, first and second active patterns on the substrate with the division region interposed therebetween, the first and the second active patterns being spaced apart from each other in a second direction perpendicular to the first direction, gate electrodes extending in the first direction and crossing the first and second active patterns, a first channel pattern on the first active pattern, and a second channel pattern on the second active pattern may be provided. The smallest width of the first active pattern may be smaller than the smallest width of the second active pattern, in the first direction. An end portion of the first channel pattern adjacent to the division (Continued)

region may include a protruding portion extending in the first direction, and the protruding portion may have a triangle shape in a plan view.

20 Claims, 37 Drawing Sheets

(51) Int. Cl.
*H01L 21/8238* (2006.01)
*H01L 27/092* (2006.01)
*H01L 29/06* (2006.01)
*H01L 29/417* (2006.01)
*H01L 29/423* (2006.01)
*H01L 29/66* (2006.01)

(52) U.S. Cl.
CPC ........ *H01L 21/823814* (2013.01); *H01L 21/823864* (2013.01); *H01L 21/823871* (2013.01); *H01L 27/092* (2013.01); *H01L 29/0665* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78618* (2013.01)

(58) Field of Classification Search
CPC ..... H01L 21/823864; H01L 21/823871; H01L 27/092; H01L 29/0665; H01L 29/41733; H01L 29/42392; H01L 29/66545; H01L 29/66553; H01L 29/66742; H01L 29/78618; H01L 29/775; H01L 29/0673; H01L 29/66439; H01L 29/165; H01L 29/7848; H01L 23/5226; H01L 23/481; H01L 23/50; H01L 23/5283; H01L 23/5286; H01L 21/823828; H01L 21/823857; H01L 21/823878; B82Y 10/00
USPC .......................................... 257/351
See application file for complete search history.

(56) References Cited

U.S. PATENT DOCUMENTS

| | | |
|---|---|---|
| 10,396,177 B2 | 8/2019 | Yamashita et al. |
| 11,799,036 B2 * | 10/2023 | Song ............. H01L 29/66545 |
| 2014/0210013 A1 | 7/2014 | Kim |
| 2015/0372104 A1 | 12/2015 | Liu et al. |
| 2017/0255735 A1 | 9/2017 | Kim et al. |
| 2019/0386099 A1 | 12/2019 | Kim et al. |
| 2020/0091145 A1 | 3/2020 | Guha et al. |
| 2020/0105893 A1 | 4/2020 | Xiao |
| 2020/0111781 A1 | 4/2020 | Kim et al. |

* cited by examiner

<br>

SEMICONDUCTOR DEVICE

CROSS-REFERENCE TO RELATED APPLICATIONS

This U.S. non-provisional patent application is a continuation of U.S. application Ser. No. 17/370,464, filed on Jul. 8, 2021, which claims priority under 35 U.S.C. § 119 to Korean Patent Application No. 10-2020-0160177, filed on Nov. 25, 2020, in the Korean Intellectual Property Office, the entire contents of each of which are hereby incorporated by reference.

BACKGROUND

The present disclosure relates to semiconductor devices, and/or in particular, to semiconductor devices including a field effect transistor.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An example embodiment of the inventive concepts provides a semiconductor device with improved electric characteristics.

According to an example embodiment of the inventive concepts, a semiconductor device may include a substrate including a division region extending in a first direction, a first active pattern and a second active pattern on the substrate with the division region interposed therebetween, the first active pattern and the second active pattern being spaced apart from each other in a second direction, the second direction being perpendicular to the first direction, gate electrodes extending in the first direction and crossing the first active pattern and the second active pattern, at least one first channel pattern on the first active pattern, and at least one second channel pattern on the second active pattern. A smallest width of the first active pattern in the first direction may be smaller than a smallest width of the second active pattern in the first direction. An end portion of the first channel pattern adjacent to the division region may include a protruding portion extending in the first direction, and the protruding portion may have a triangle shape, when viewed in a plan view.

According to an example embodiment of the inventive concepts, a semiconductor device may include a division region extending in a first direction, a first active pattern and a second active pattern on a substrate with the division region interposed therebetween, the first active pattern and the second active pattern being spaced apart from each other in a second direction, the second direction being perpendicular to the first direction, gate electrodes extending in the first direction and crossing the first active pattern or second active pattern, at least one first channel pattern on the first active pattern, and at least one second channel pattern on the second active pattern. The division region may be defined by a trench. A first width in the first direction of a side surface of the first channel pattern that is vertically aligned with an inner side surface of the trench may be larger than the smallest width of the first channel pattern in the first direction. The first width may be smaller than a smallest width of the second channel pattern in the first direction.

According to an example embodiment of the inventive concepts, a semiconductor device may include a device isolation layer on a substrate and extending in a first direction, a first active pattern and a second active pattern on the substrate with the device isolation layer interposed therebetween, the first active pattern and the second active pattern being spaced apart from each other in a second direction, the second direction being perpendicular to the first direction, gate electrodes extending in the first direction and crossing the first active pattern and second active pattern, gate spacers on side surfaces of the gate electrodes, a first channel pattern on the first active pattern, a second channel pattern on the second active pattern, and source/drain patterns spaced apart from each other with the gate electrodes interposed therebetween. A smallest width of the first active pattern in the first direction may be smaller than a smallest width of the second active pattern in the first direction. An end portion of the first channel pattern adjacent to the device isolation layer may include a protruding portion extending in the first direction. When viewed in a plan view, the protruding portion may have a triangle shape, and a portion of the second channel pattern adjacent to the device isolation layer may have a square or rectangular shape.

DETAILED DESCRIPTION

Example embodiments of the inventive concepts will now be described more fully with reference to the accompanying drawings, in which some example embodiments are shown.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
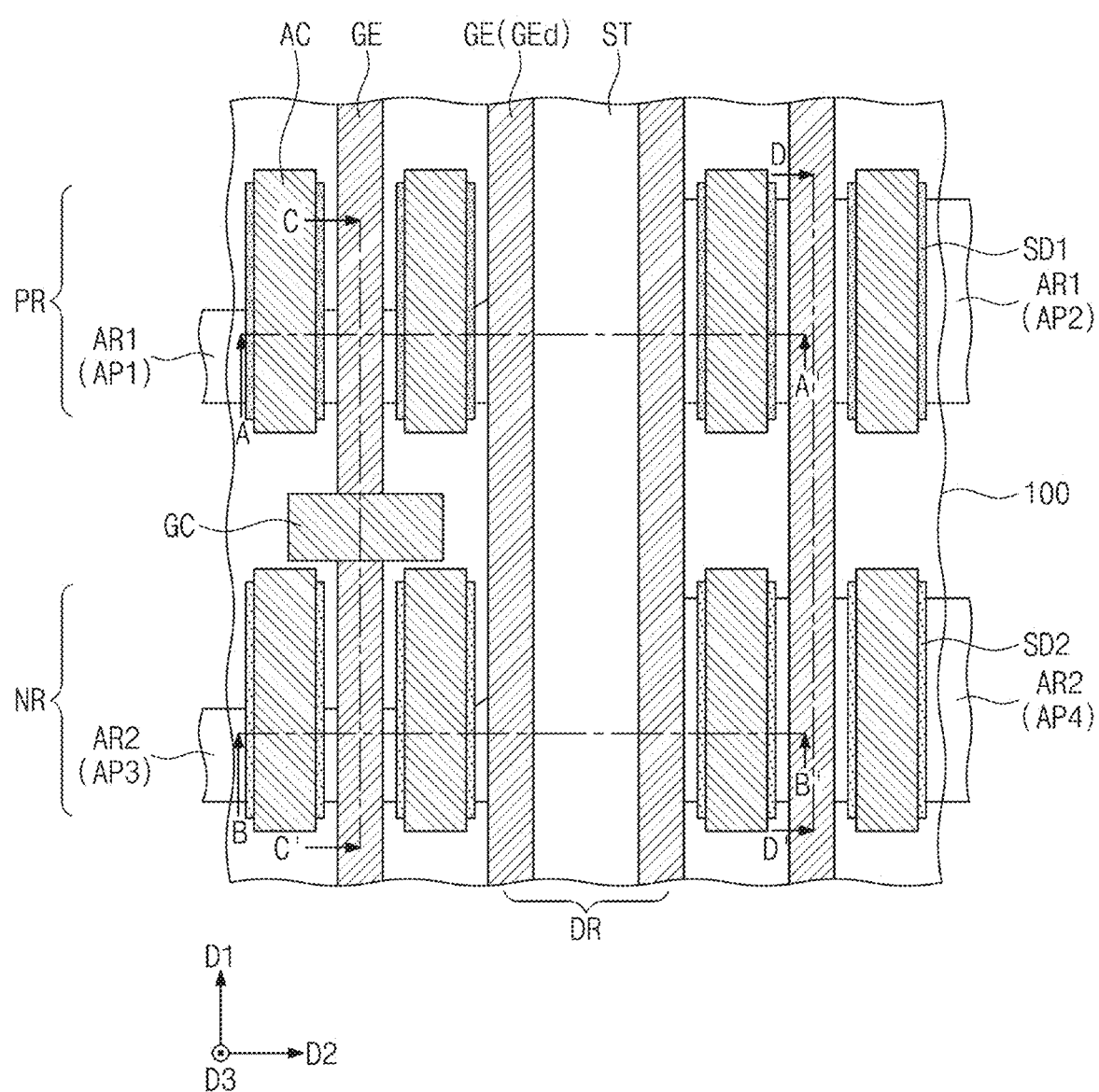
FIG. 1 is a plan view illustrating a semiconductor device according to an example embodiment of the inventive concepts.
Figure 2A:
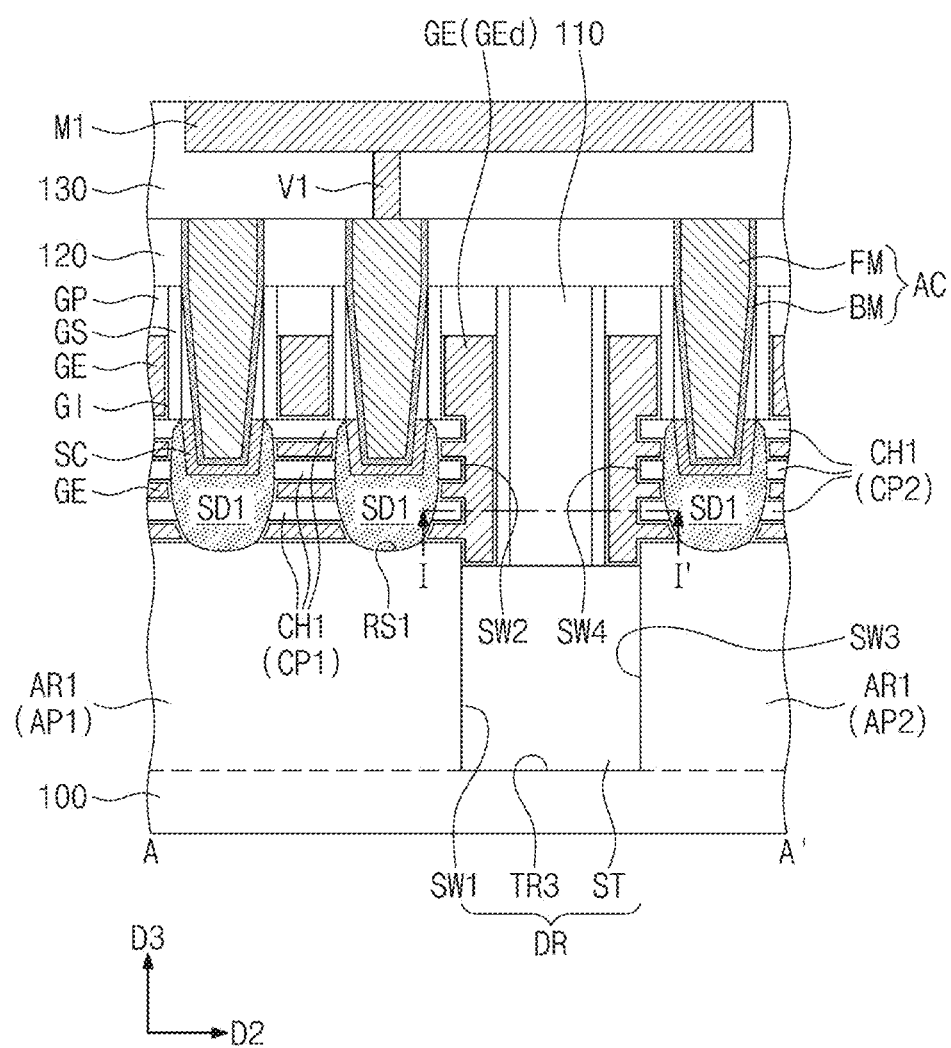
FIGS. 2A, 2B, 2C and 2D are sectional views, which are respectively taken along lines A-A', B-B', C-C', and D-D' of FIG. 1.
Figure 2B:
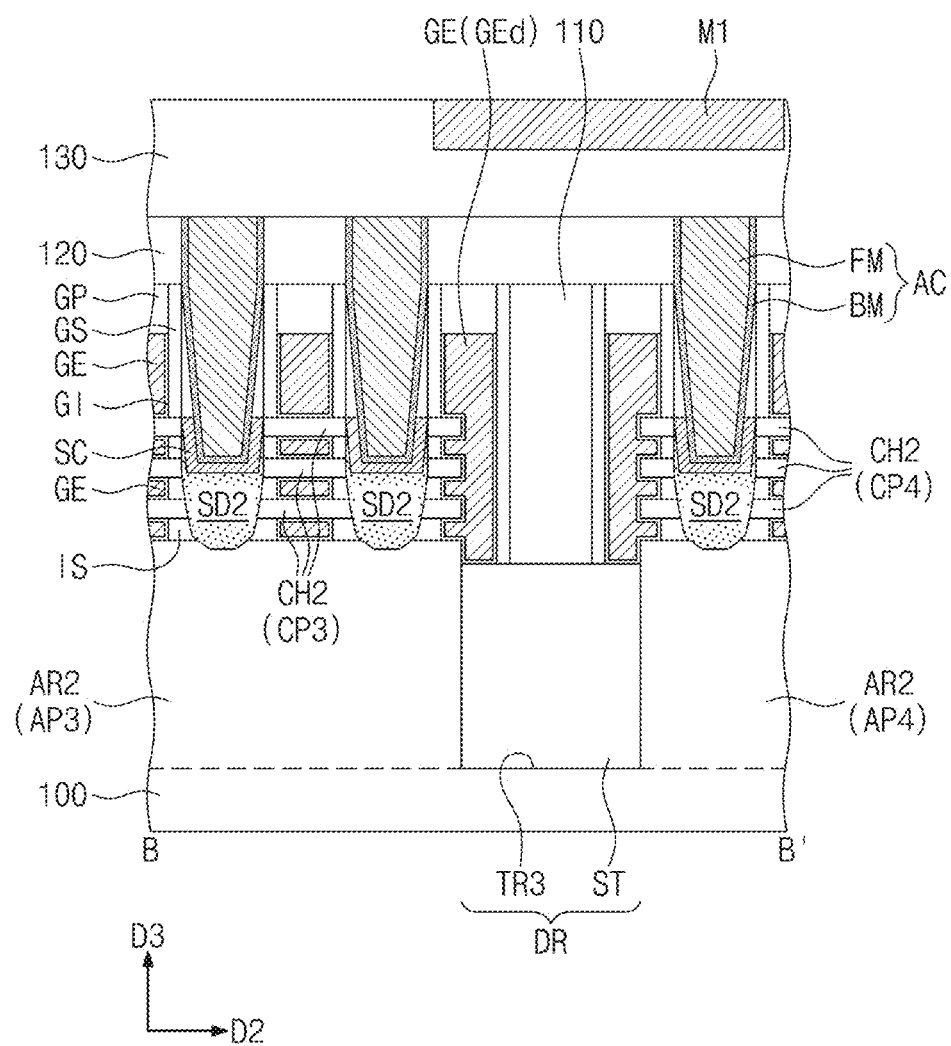
Figure 2C:
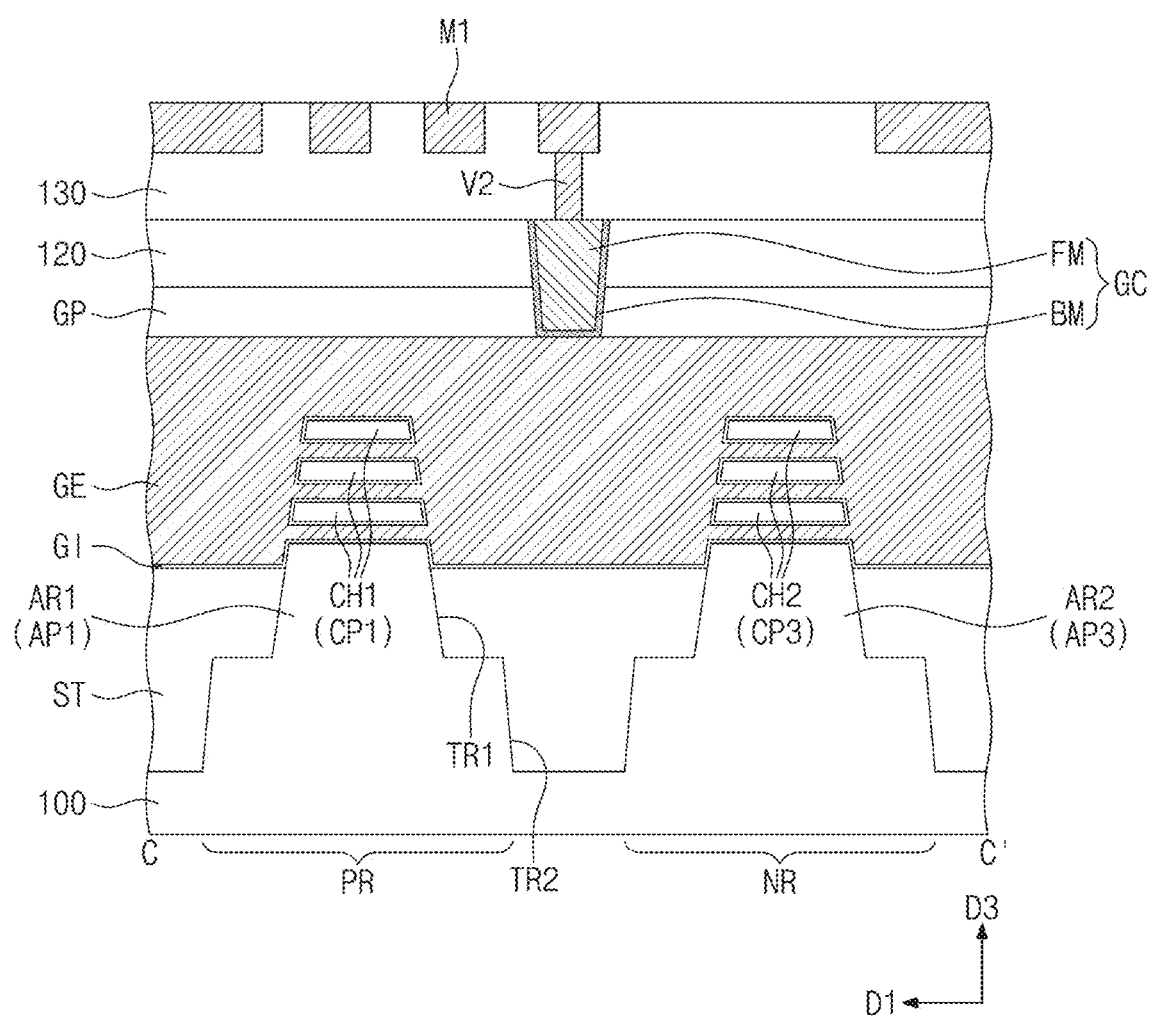
Figure 2D:
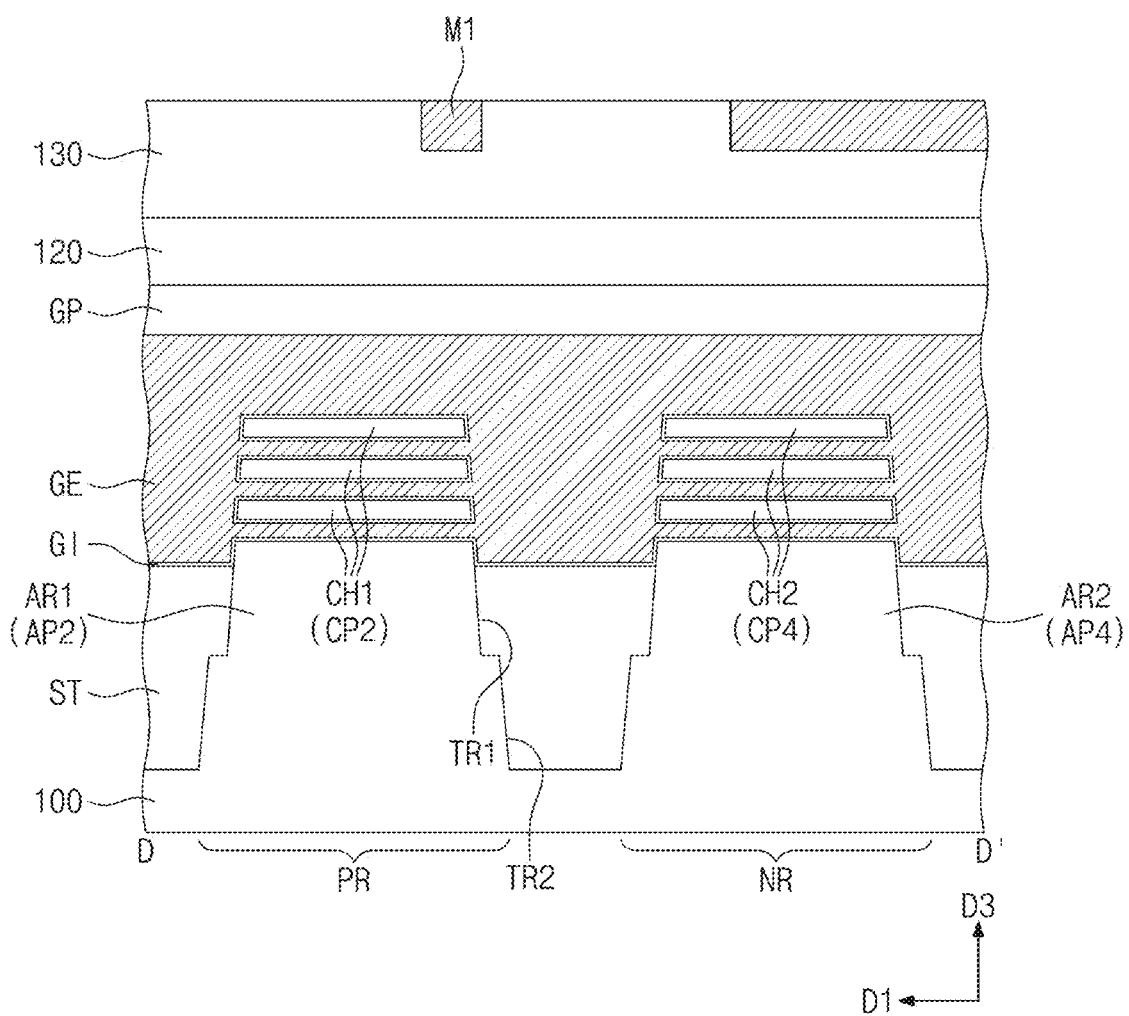

FIG. 1 is a plan view illustrating a semiconductor device according to an example embodiment of the inventive concepts. FIGS. 2A, 2B, 2C and 2D are sectional views, which are respectively taken along lines A-A', B-B', C-C', and D-D' of FIG. 1. FIGS. 3A, 3B, 3C, and 3D are top plan views taken along line I-I' of FIG. 2A.

Referring to FIGS. 1 and 2A to 2D, a substrate 100 may be provided. The substrate 100 may include a semiconductor substrate, which is formed of or includes one of silicon (Si), germanium (Ge), or silicon-germanium (SiGe), or a compound semiconductor substrate. For example, the substrate 100 may be a silicon wafer. The substrate 100 may include a first cell region PR and a second cell region NR. The first and second cell regions PR and NR may be defined by a second trench TR2, which is formed in an upper portion of the substrate 100. In other words, the second trench TR2 may be located between the first and second cell regions PR and NR. The first and second cell regions PR and NR may be spaced apart from each other in a first direction D1, which is parallel to a top surface of the substrate 100, with the second trench TR2 interposed therebetween.

In an example embodiment, each of the first and second cell regions PR and NR may be a logic cell, and logic transistors constituting a logic circuit may be provided on the logic cell. As an example, the first cell region PR may be a region, on which PMOS field effect transistors are provided, and the second cell region NR may be a region, on which NMOS field effect transistors are provided.

A first active region AR1 and a second active region AR2 may be defined by a first trench TR1, which is formed in the upper portion of the substrate 100. The first and second active regions AR1 and AR2 may be provided on the first and second cell regions PR and NR, respectively. The first trench TR1 may be shallower than the second trench TR2. The first and second active regions AR1 and AR2 may be extended in a second direction D2. The second direction D2 may be parallel to the top surface of the substrate 100 and may be perpendicular to the first direction D1. The first and second active regions AR1 and AR2 may be portions of the substrate 100 protruding in a third direction D3. The third direction D3 may be perpendicular to the top surface of the substrate 100.

The substrate 100 may include a division region DR extending in the first direction D1. The division region DR may be located on a boundary between the logic cells. A third trench TR3 may be formed on the division region DR. The logic cells may be separated from each other by the third trench TR3.

The first active region AR1 may include a first active pattern AP1 and a second active pattern AP2. The second active region AR2 may include a third active pattern AP3 and a fourth active pattern AP4. The first and second active patterns AP1 and AP2 may be defined by the third trench TR3. Further, the third and fourth active patterns AP3 and AP4 may be defined by the third trench TR3. In other words, the third trench TR3 may be located between the first and second active patterns AP1 and AP2 and between the third and fourth active patterns AP3 and AP4. The first and second active patterns AP1 and AP2 may be spaced apart from each other in the second direction D2 with the third trench TR3 interposed therebetween, and the third and fourth active patterns AP3 and AP4 may be spaced apart from each other in the second direction D2 with the third trench TR3 interposed therebetween.

A width of the first active pattern AP1 in the first direction D1 may be smaller than a width of the second active pattern AP2 in the first direction D1. For example, a width of the first active region AR1, which is measured on the division region DR and in the first direction D1, may gradually increase in the second direction D2. A width of the third active pattern AP3 in the first direction D1 may be smaller than a width of the fourth active pattern AP4 in the first direction D1. For example, a width of the second active region AR2, which is measured on the division region DR and in the first direction D1, may gradually increase in the second direction D2.

A device isolation layer ST may fill the first to third trenches TR1, TR2, and TR3. The device isolation layer ST may include a silicon oxide layer. Upper portions of the first and second active regions AR1 and AR2 may vertically protrude above the device isolation layer ST (e.g., see FIG. 2C). In other words, the device isolation layer ST may not cover the upper portions of the first and second active regions AR1 and AR2. The device isolation layer ST may cover lower side surfaces of the first and second active regions AR1 and AR2.

A plurality of first channel layers CH1 may be provided on the first active region AR1. The first channel layers CH1 may include first channel patterns CP1 and second channel patterns CP2. The first channel patterns CP1 may be provided on the first active pattern AP1, and the second channel patterns CP2 may be provided on the second active pattern AP2.

The first active pattern AP1 may have a first side surface SW1 defined by the third trench TR3, and the first channel patterns CP1 may have a second side surface SW2 defined by the third trench TR3. The first side surface SW1 and the second side surface SW2 may be vertically aligned to each other. The second active pattern AP2 may have a third side surface SW3 defined by the third trench TR3, and the second channel patterns CP2 may have a fourth side surface SW4 defined by the third trench TR3. The third side surface SW3 and the fourth side surface SW4 may be vertically aligned to each other.

A plurality of second channel layers CH2 may be provided on the second active region AR2. The second channel layers CH2 may include third channel patterns CP3 and fourth channel patterns CP4. The third channel patterns CP3 may be provided on the third active pattern AP3, and the fourth channel patterns CP4 may be provided on the fourth active pattern AP4. For example, the channel patterns CH1 to CH4 may be formed of or include at least one of silicon (Si), germanium (Ge), or silicon-germanium (SiGe). In an example embodiment, the first and second channel layers CH1 and CH2 may be formed of or include silicon (Si).

A plurality of first recesses RS1 may be formed in the upper portion of the first active region AR1. First source/drain patterns SD1 may be provided in the first recesses RS1, respectively. The first source/drain patterns SD1 may be impurity regions of a first conductivity type (e.g., p-type).

The first channel layers CH1 may be interposed between a pair of the first source/drain patterns SD1. In other words, the first channel layers CH1 may connect the pair of the first source/drain patterns SD1 to each other. For example, the first channel patterns CP1 may be interposed between the pair of the first source/drain patterns SD1, which are provided on the first active pattern AP1. The second channel patterns CP2 may be interposed the pair of the first source/drain patterns SD1, which are provided on the second active pattern AP2.

A plurality of second recesses RS2 may be formed in the upper portion of the second active region AR2. Second source/drain patterns SD2 may be provided in the second recesses RS2, respectively. The second source/drain patterns SD2 may be impurity regions of a second conductivity type (e.g., n-type). The second channel layers CH2 may be interposed between a pair of the second source/drain patterns SD2. In other words, the second channel layers CH2 may connect the pair of the second source/drain patterns SD2 to each other. For example, the third channel patterns CP3 may be interposed between the pair of the second source/drain patterns SD2, which are provided on the third active pattern AP3. The fourth channel patterns CP4 may be interposed between the pair of the second source/drain patterns SD2, which are provided on the fourth active pattern AP4.

The first and second source/drain patterns SD1 and SD2 may be epitaxial patterns, which are formed by a selective epitaxial growth (SEG) process. In an example embodiment, the first and second source/drain patterns SD1 and SD2 may have top surfaces that are located at substantially the same level as top surfaces of the uppermost ones of the first and second channel layers CH1 and CH2, respectively. In the present specification, the term 'level' will be used to represent a vertical position measured from the bottom surface of the substrate 100. However, the inventive concepts are not limited to this example, and the top surfaces of the first and second source/drain patterns SD1 and SD2 may be higher than the top surfaces of the uppermost ones of the first and second channel layers CH1 and CH2.

The first source/drain patterns SD1 may be formed of or include a semiconductor material (e.g., SiGe) whose lattice constant is larger than a lattice constant of a semiconductor material of the substrate 100. In this case, the pair of the first source/drain patterns SD1 may exert a compressive stress on the first channel layer CH1 therebetween. The second source/drain patterns SD2 may be formed of or include the same semiconductor material (e.g., Si) as the substrate 100.

Gate electrodes GE may be provided to cross the first and second active regions AR1 and AR2 and to extend in the first direction D1. The gate electrodes GE may be spaced apart from each other in the second direction D2. The gate electrodes GE may vertically overlap the first and second channel layers CH1 and CH2. The gate electrodes GE may be provided on top, bottom, and side surfaces of each of the first and second channel layers CH1 and CH2. The gate electrodes GE may fill spaces between the first channel layers CH1 and between the second channel layers CH2. In other words, a logic transistor according to an example embodiment of the inventive concepts may be a three-dimensional field effect transistor, in which the gate electrode GE is provided to three-dimensionally surround the first and second channel layers CH1 and CH2.

The gate electrodes GE may include dummy gate electrodes GEd. The dummy gate electrodes GEd may be disposed adjacent to the division region DR. Portions of the dummy gate electrodes GEd may be extended into regions, which are provided between the first and second channel layers CH1 and CH2 and adjacent to the division region DR. Another portion of the dummy gate electrode GEd may be extended downward toward the device isolation layer ST filling the third trench TR3. As an example, the gate electrode GE may be formed of or include at least one of conductive metal nitrides (e.g., titanium nitride or tantalum nitride) or metallic materials (e.g., titanium, tantalum, tungsten, copper, or aluminum).

A pair of gate spacers GS may be disposed on opposite side surfaces of each of the gate electrodes GE. The gate spacers GS may be extended along the gate electrode GE or in the first direction D1. The gate spacers GS may have top surfaces that are higher than a top surface of the gate electrode GE. The top surfaces of the gate spacers GS may be coplanar with a top surface of a first interlayer insulating layer 110, which will be described below.

The gate spacer GS on the division region DR may be extended downward from a side surface of a gate capping pattern GP, which will be described below, toward the device isolation layer ST filling the third trench TR3. The gate spacers GS may be formed of or include at least one of SiCN, SiCON, or SiN. In an example embodiment, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiCON, or SiN.

A gate insulating layer GI may be interposed between the gate electrode GE and the first channel layers CH1 and between the gate electrode GE and the second channel layers CH2. The gate insulating layer GI may be provided to cover top, bottom, and opposite side surfaces of each of the first and second channel layers CH1 and CH2. The gate insulating layer GI may also cover a top surface of the device isolation layer ST, which is located below the gate electrode GE.

The gate insulating layer GI may cover a portion of the top surface of the device isolation layer ST, which is located below the gate electrode GEd and on the division region DR. The gate insulating layer GI on the division region DR may cover a side surface of each of the first and second channel layers CH1 and CH2, which are located adjacent to the division region DR.

For example, the gate insulating layer GI may include a silicon oxide layer, a silicon oxynitride layer, and/or a high-k dielectric layer. As an example, the high-k dielectric layer may be formed of or include a high-k dielectric material whose dielectric constant is higher than a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Inner spacers IS may be interposed between the second source/drain pattern SD2 and the gate insulating layer GI. Each of the inner spacers IS may separate the gate insulating layer GI from the second source/drain pattern SD2. The inner spacers IS may be in direct contact with the second source/drain pattern SD2. As an example, the inner spacers IS may be formed of or include silicon nitride.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS.

The first interlayer insulating layer 110 on the division region DR may be extended downward toward the device isolation layer ST filling the third trench TR3. In other words, the first interlayer insulating layer 110 may have a bottom surface that is in contact with the top surface of the device isolation layer ST.

A second interlayer insulating layer 120 may be formed on the first interlayer insulating layer 110 to cover the gate capping pattern GP. As an example, the first and second interlayer insulating layers 110 and 120 may be formed of or include silicon oxide.

Active contacts AC may be provided to penetrate the first and second interlayer insulating layers 110 and 120 and may be electrically connected to the first and second source/drain patterns SD1 and SD2, respectively. For example, a pair of the active contacts AC may be respectively provided at both sides of the gate electrode GE. When viewed in a plan view, the active contact AC may be a bar-shaped pattern extending in the first direction D1.

The active contact AC may be a self-aligned contact. In other words, the active contact AC may be formed in a self-aligned manner using the gate capping pattern GP and the gate spacer GS. For example, the active contact AC may cover at least a portion of a side surface of the gate spacer GS. Although not shown, the active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 and SD2 through the silicide pattern SC. The silicide pattern SC may be formed of or include at least one of metal silicide materials (e.g., titanium silicide, tantalum silicide, tungsten silicide, nickel silicide, or cobalt silicide).

A gate contact GC may be provided to penetrate the second interlayer insulating layer 120 and the gate capping pattern GP and to be electrically connected to the gate electrode GE. The gate contact GC may be provided on the device isolation layer ST between the first and second cell regions PR and NR. For example, the gate contact GC may be a bar-shaped pattern extending in the second direction D2.

Each of the active contacts and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may include at least one of a titanium nitride layer (TiN), a tantalum nitride layer (TaN), a tungsten nitride layer (WN), a nickel nitride layer (NiN), a cobalt nitride layer (CoN), or a platinum nitride layer (PtN).

A third interlayer insulating layer 130 may be provided on the second interlayer insulating layer 120. First interconnection lines M1, a first via V1, and a second via V2 may be provided in the third interlayer insulating layer 130. The first and second vias V1 and V2 may be provided below the first interconnection lines M1. The first interconnection lines M1 may be extended in the first direction D1. The first interconnection lines M1 may be arranged in the first or second direction D1 or D2. Each of the first vias V1 may be provided between one of the first interconnection lines M1 and one of the active contacts AC to electrically connect them to each other. Each of the second vias V2 may be provided between one of the first interconnection lines M1 and one of the gate contacts GC to electrically connect them to each other.

The first interconnection line M1 and the first or second via V1 or V2 may be connected to each other, thereby forming a single conductive structure. In an example embodiment, the first interconnection line M1 and the first or second via V1 or V2 may be formed together through the same process. As an example, the first interconnection line M1 and the first or second via V1 or V2 may be a single conductive structure, which is formed by a dual damascene process. Although not shown, a plurality of stacked metal layers may be further provided on the third interlayer insulating layer 130.

The planar structure of the first and third channel patterns CP1 and CP3 will be described in more detail with reference to FIGS. 3A, 3B, 3C, and 3D. For example. FIGS. 3A, 3B, 3C, and 3D illustrate portions of semiconductor devices according to some example embodiments, which will be described with reference to FIGS. 5A, 5B, 5C, and 5D, respectively.

Figure 3A:
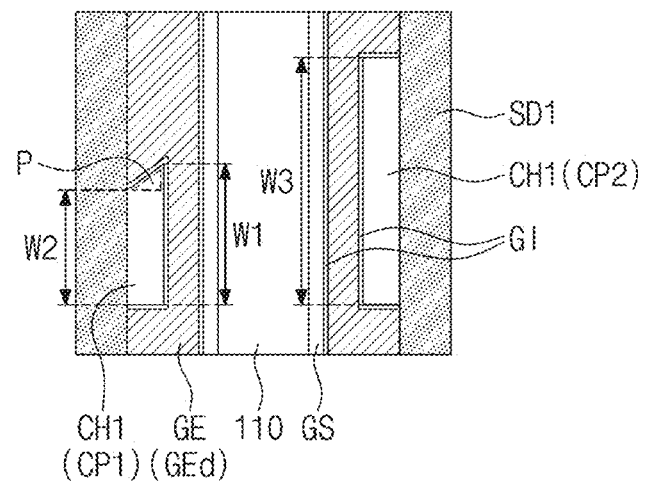
FIGS. 3A, 3B, 3C, and 3D are top plan views taken along line I-I' of FIG. 2A.

Referring to FIG. 3A, an end portion of each of the first channel patterns CP1 adjacent to the division region DR may include a protruding portion P, when viewed in a plan view. At least a portion of the protruding portion P may be in contact with the first source/drain pattern SD1. The protruding portion P may be extended from a side surface of each of the first channel patterns CP1 in the first direction D1. When viewed in a plan view, the protruding portion P may have an orthogonal triangle shape or an equilateral triangle shape. Thus, a portion of the first channel pattern CP1 excluding the protruding portion P may have a rectangular shape or a square shape. Accordingly, the first channel patterns CP1 may have a trapezoid shape.

Accordingly, a first width W1 of a side surface of the first channel pattern CP1, which is coplanar with (or alternatively, flush with or vertically aligned with) an inner side surface of the third trench TR3 or is in contact with a side surface of the division region DR, in the first direction D1 may be larger than the smallest width W2 of the first channel pattern CP1 in the first direction D1. The smallest width W2 of the first channel pattern CP1 may be smaller than the smallest width W3 of the second channel pattern CP2 in the first direction D1. The first width W1 of the first channel pattern CP1 may be smaller than the smallest width W3 of the second channel pattern CP2. In other words, a width of the protruding portion P in the first direction D1 may increase in the second direction D2. For example, the protruding portion P may have a hypotenuse that is inclined at an obtuse angle (e.g., of 90' or greater) relative to a side of the first source/drain pattern SD1 crossing the first channel pattern CP1.

When viewed in a plan view, the second channel patterns CP2, which are adjacent to the division region DR, may have a square or rectangular shape. Although not shown, an end portion of each of the third channel patterns CP3 adjacent to the division region DR may include the protruding portion P, which has substantially the same planar structure as the protruding portion P of the first channel pattern CP1.

Figure 3B:
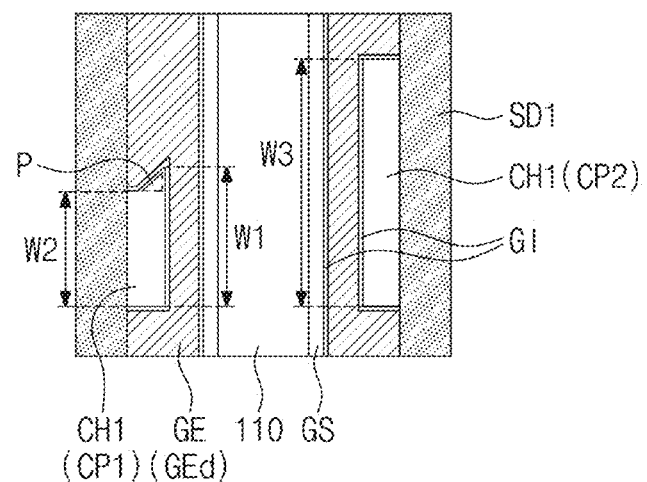

Referring to FIG. 3B, the end portion of each of the first channel patterns CP1 adjacent to the division region DR may include the protruding portion P, when viewed in a plan view. The protruding portion P may be spaced apart from the first source/drain pattern SD1. The protruding portion P of FIG. 3B may have substantially the same structure as that of FIG. 3A, except that the protruding portion P is spaced apart from the first source/drain pattern SD1.

Figure 3C:
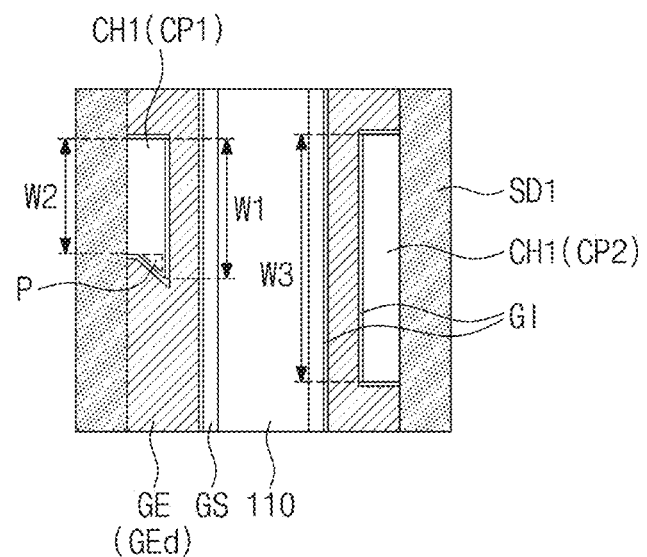

Referring to FIG. 3C, the end portion of each of the first channel patterns CP1 adjacent to the division region DR may include a protruding portion P, which is extended in a direction opposite to the first direction D1, when viewed in a plan view. The protruding portion P may be spaced apart from the first source/drain pattern SD1. Except for the afore-described features, the protruding portion P may have substantially the same structure as that of FIG. 3A.

Figure 3D:
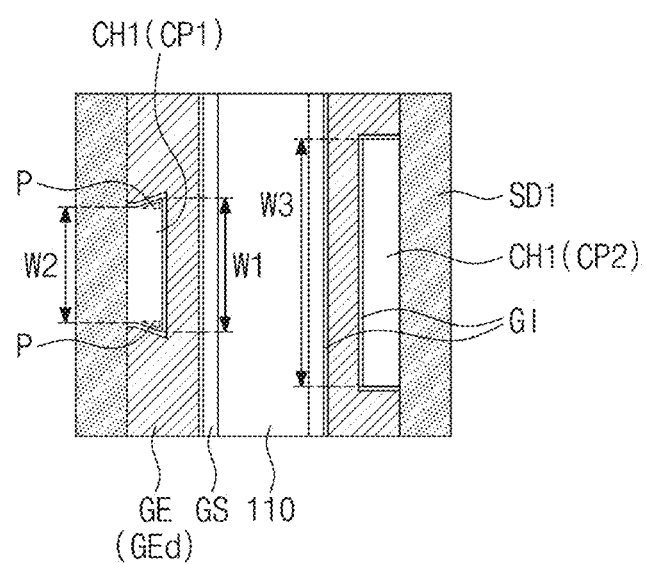

Referring to FIG. 3D, each of the first channel patterns CP1 adjacent to the division region DR may include a pair of the protruding portions P, which are opposite to each other in the first direction D1 when viewed in a plan view. At least one of the protruding portions P may be spaced apart from the first source/drain pattern SD1. However, unlike that illustrated in FIG. 3D, at least one of the protruding portions P may be in contact with the first source/drain pattern SD1. Except for the afore-described features, the protruding portion P may have substantially the same structure as described with reference to FIG. 3A.

According to an example embodiment of the inventive concepts, the first channel pattern CP1, which is adjacent to the division region DR and has a smaller width than the second channel pattern CP2, may include the protruding portion P provided at its end portion, and thus, it may be possible to mitigate of prevent a short failure from occurring between the first and second source/drain patterns SD1 and SD2 and the gate electrodes GE, which are adjacent to the division region DR. Accordingly, it may be possible to improve performance and electric characteristics of a semiconductor device.

FIGS. 5A, 5B, 5C, 5D, 7, 9, 11, 14, and 16 are plan views illustrating a method of fabricating a semiconductor device, according to an example embodiment of the inventive concepts. FIGS. 4, 6, 8A, 10A, 12A, 13A, 15A, and 17A are sectional views, which are taken along the line A-A' of FIG. 1 to illustrate a method of fabricating a semiconductor device, according to an example embodiment of the inventive concepts. FIGS. 10B, 12B, 13B, 15B, and 17B are sectional views, which are taken along the line B-B' of FIG. 1 to illustrate a method of fabricating a semiconductor device, according to an example embodiment of the inventive concepts. FIGS. 8B, 10C, 13C, 15C, and 17C are sectional views, which are taken along the line C-C' of FIG. 1 to illustrate a method of fabricating a semiconductor device, according to an example embodiment of the inventive concepts. FIGS. 8C, 10D, 13D, 15D, and 17D are sectional views, which are taken along the line D-D' of FIG. 1 to illustrate a method of fabricating a semiconductor device, according to an example embodiment of the inventive concepts.

Figure 4:
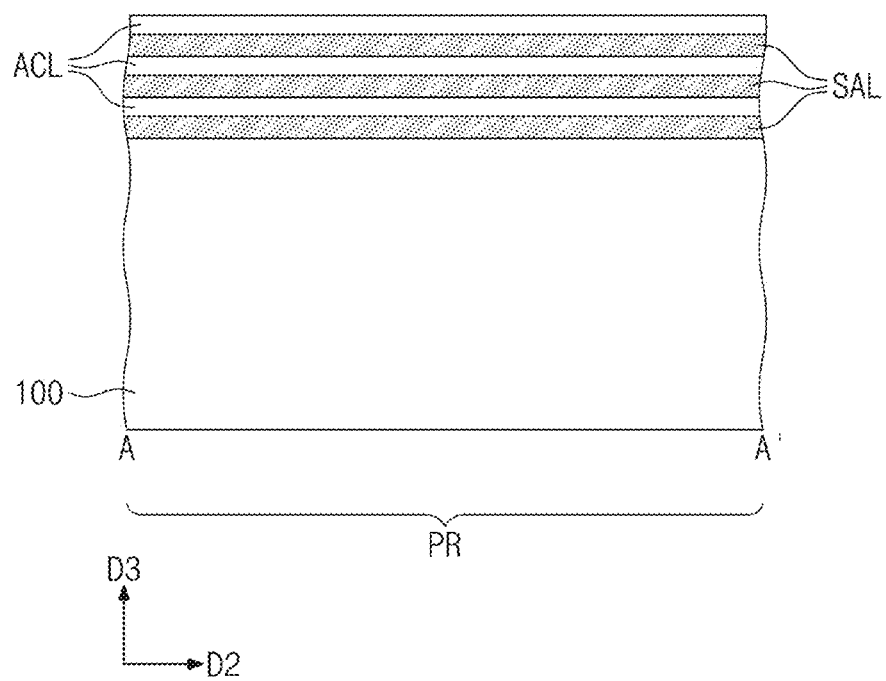
FIGS. 4, 6, 8A, 10A, 12A, 13A, 15A, and 17A are sectional views, which are taken along the line A-A' of FIG. 1 to illustrate a method of fabricating a semiconductor device, according to an example embodiment of the inventive concepts.
Figure 5A:
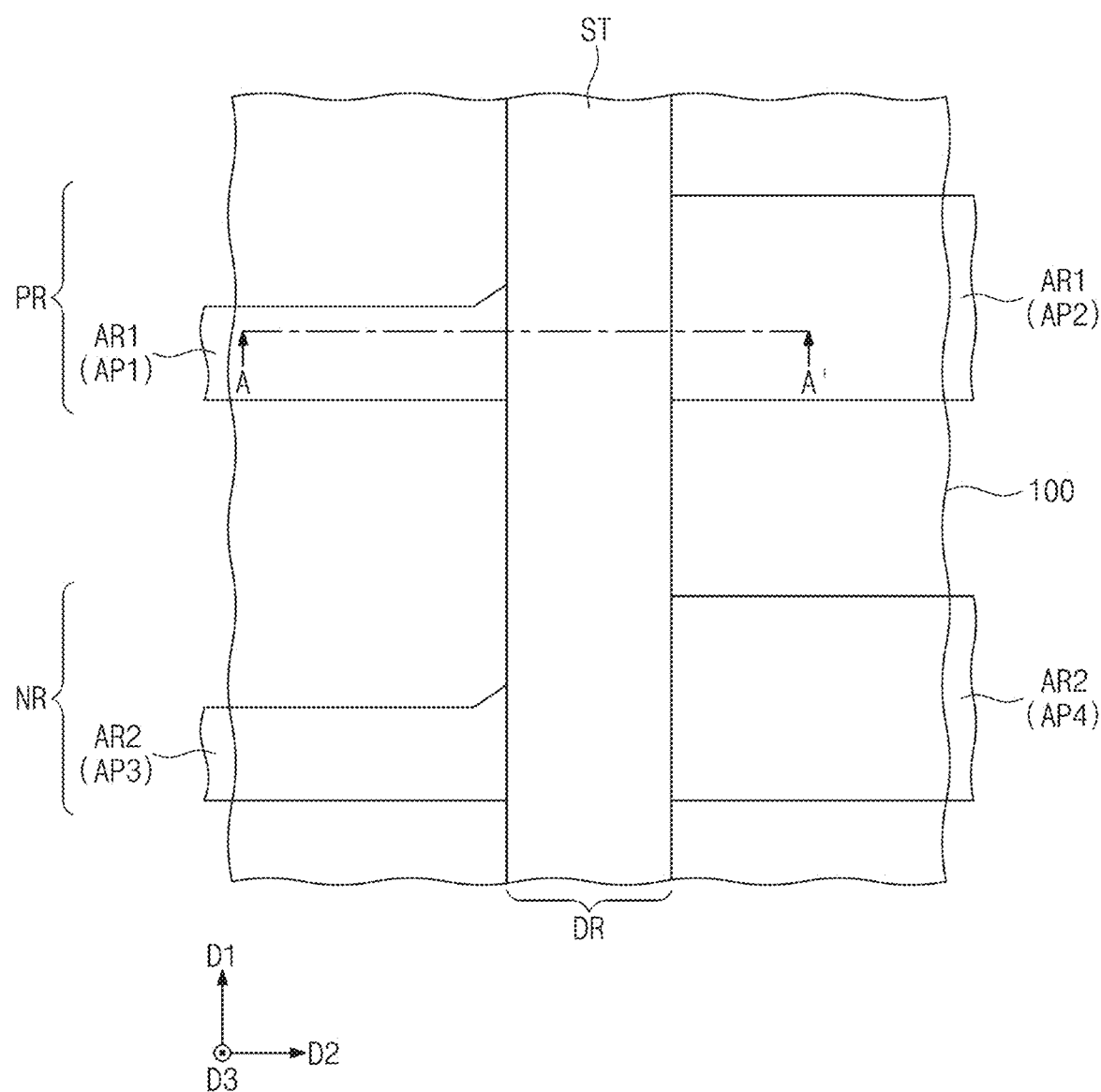
FIGS. 5A, 5B, 5C, 5D, 7, 9, 11, 14, and 16 are plan views illustrating a method of fabricating a semiconductor device, according to an example embodiment of the inventive concepts.
Figure 5B:
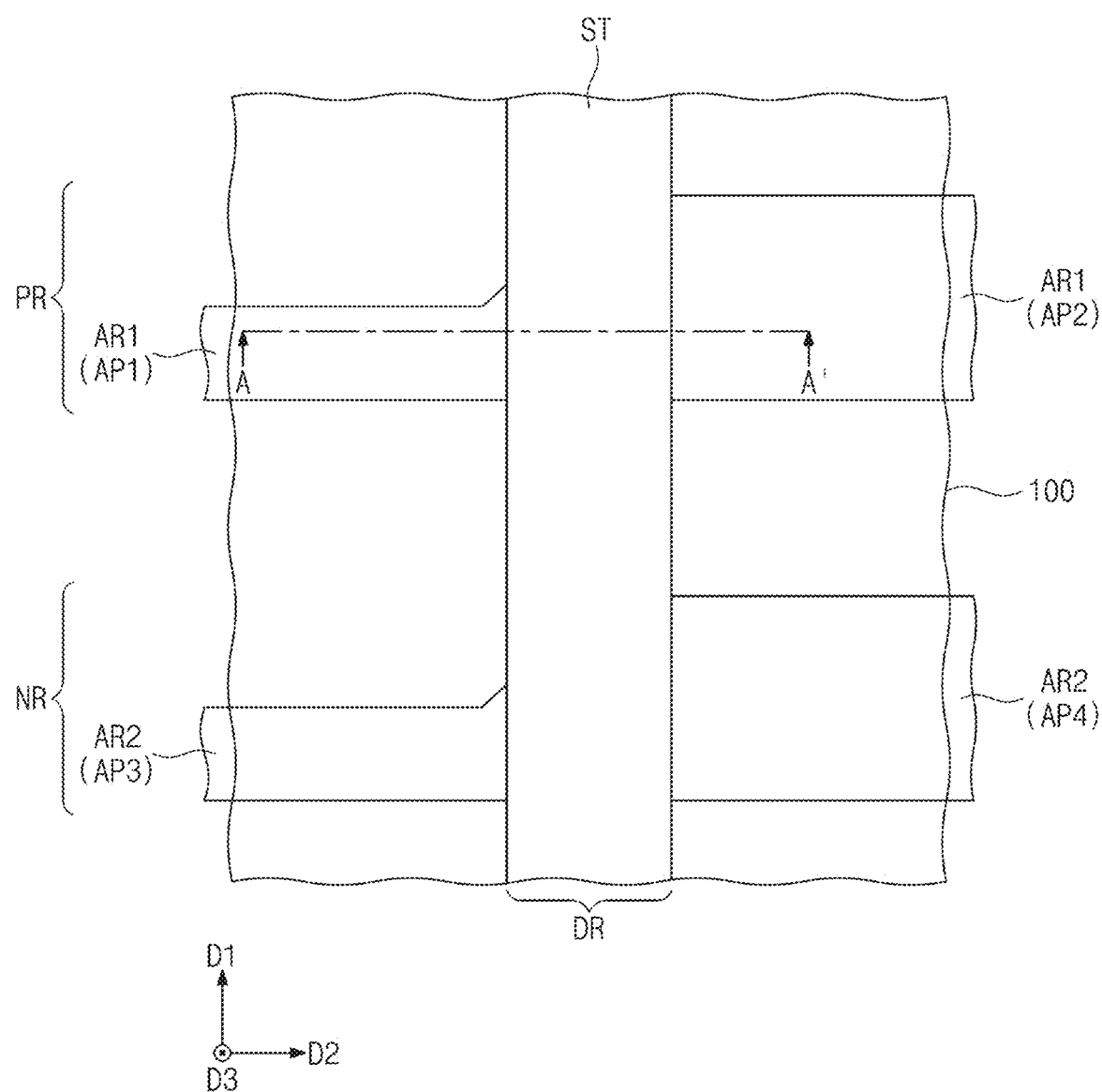
Figure 5C:
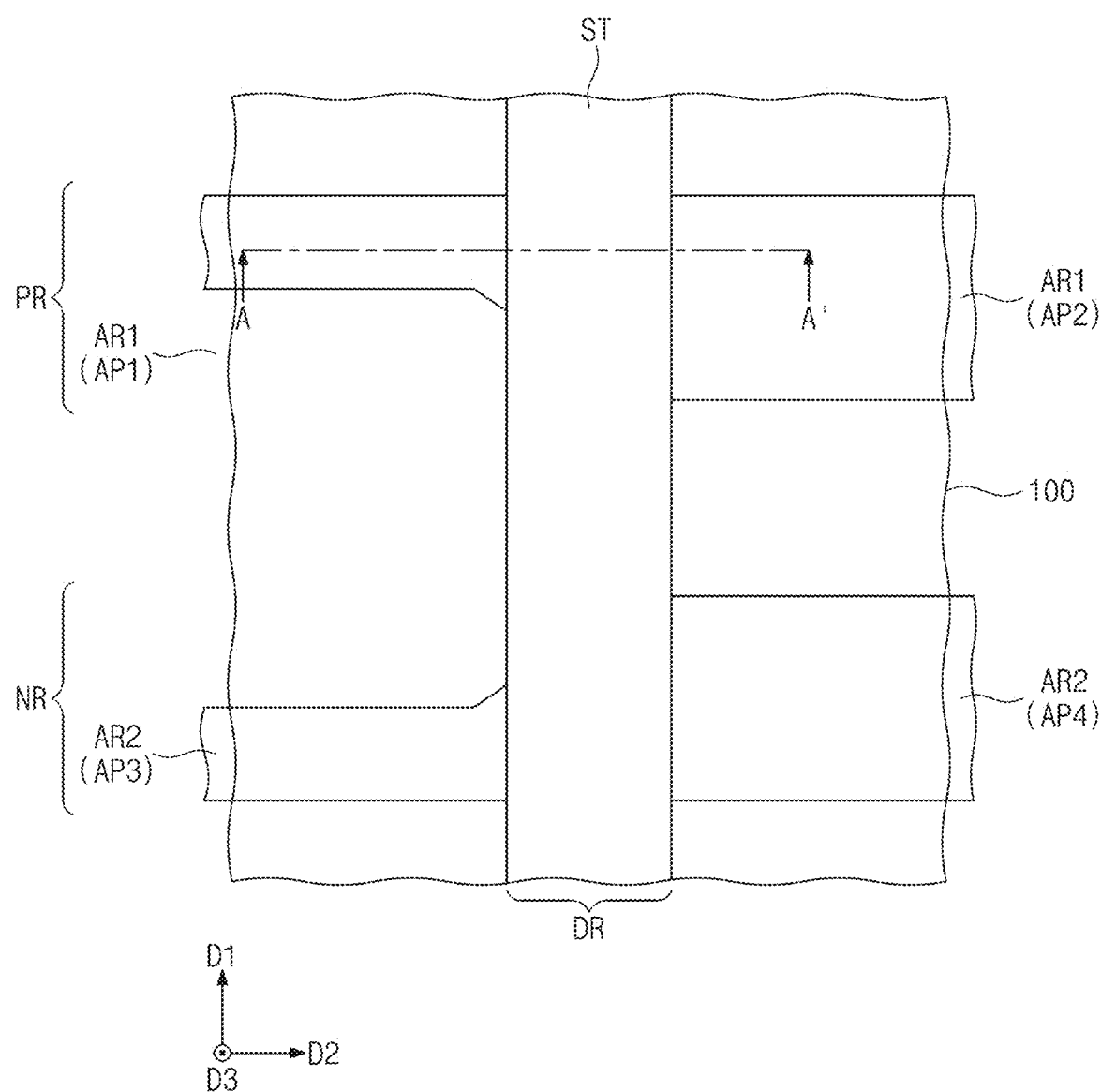
Figure 5D:
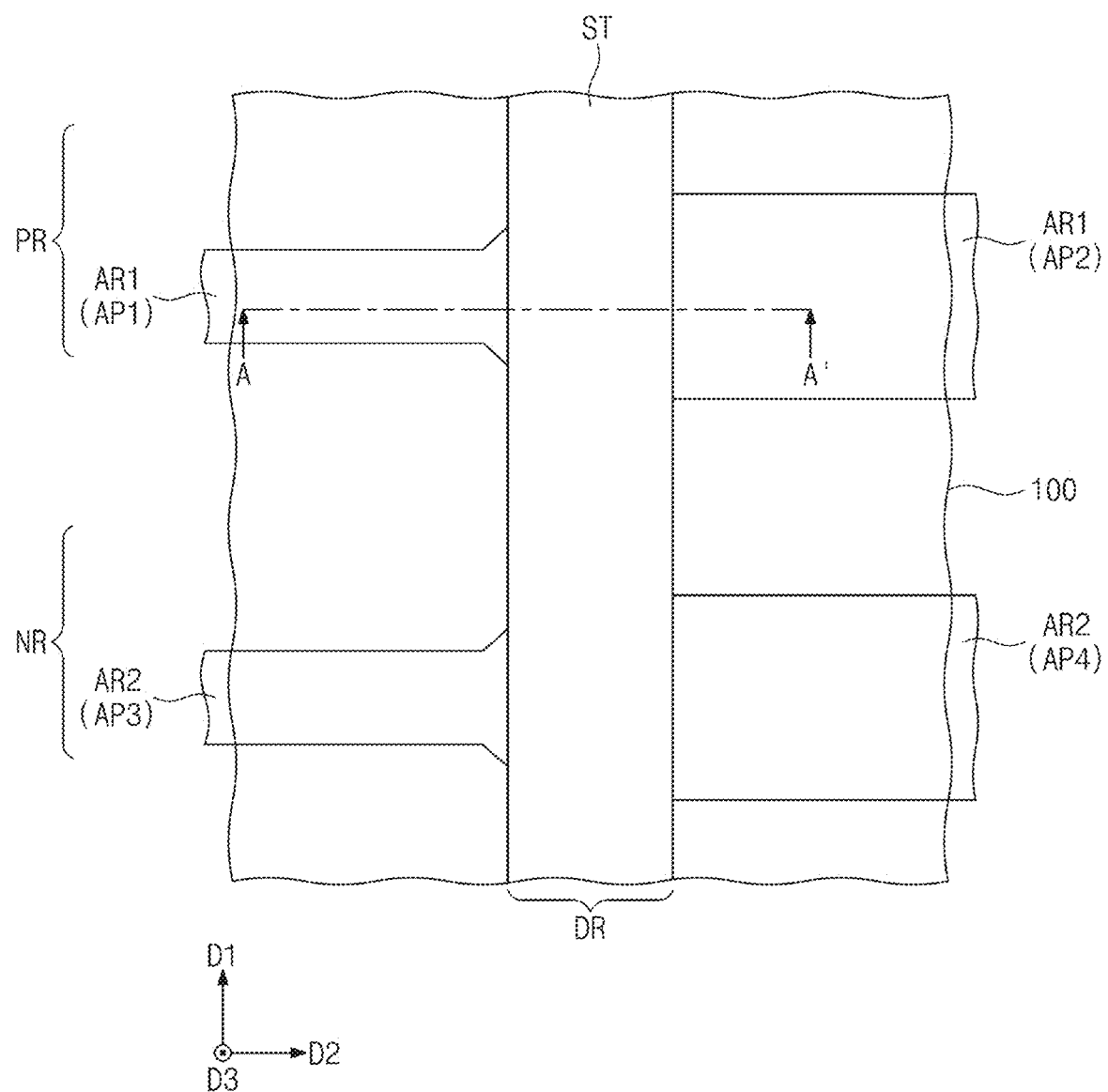
Figure 6:
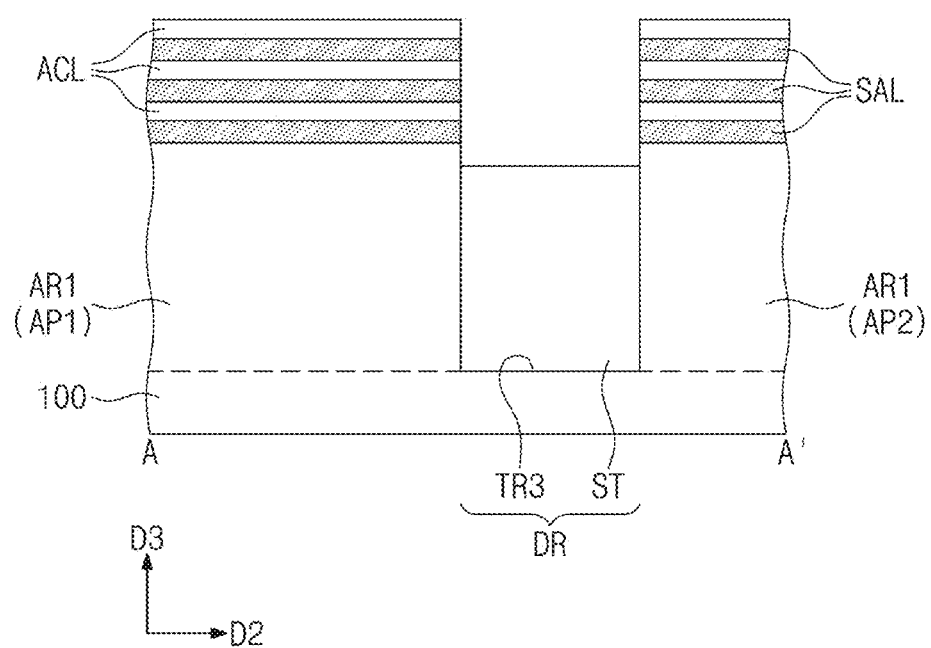
Figure 7:
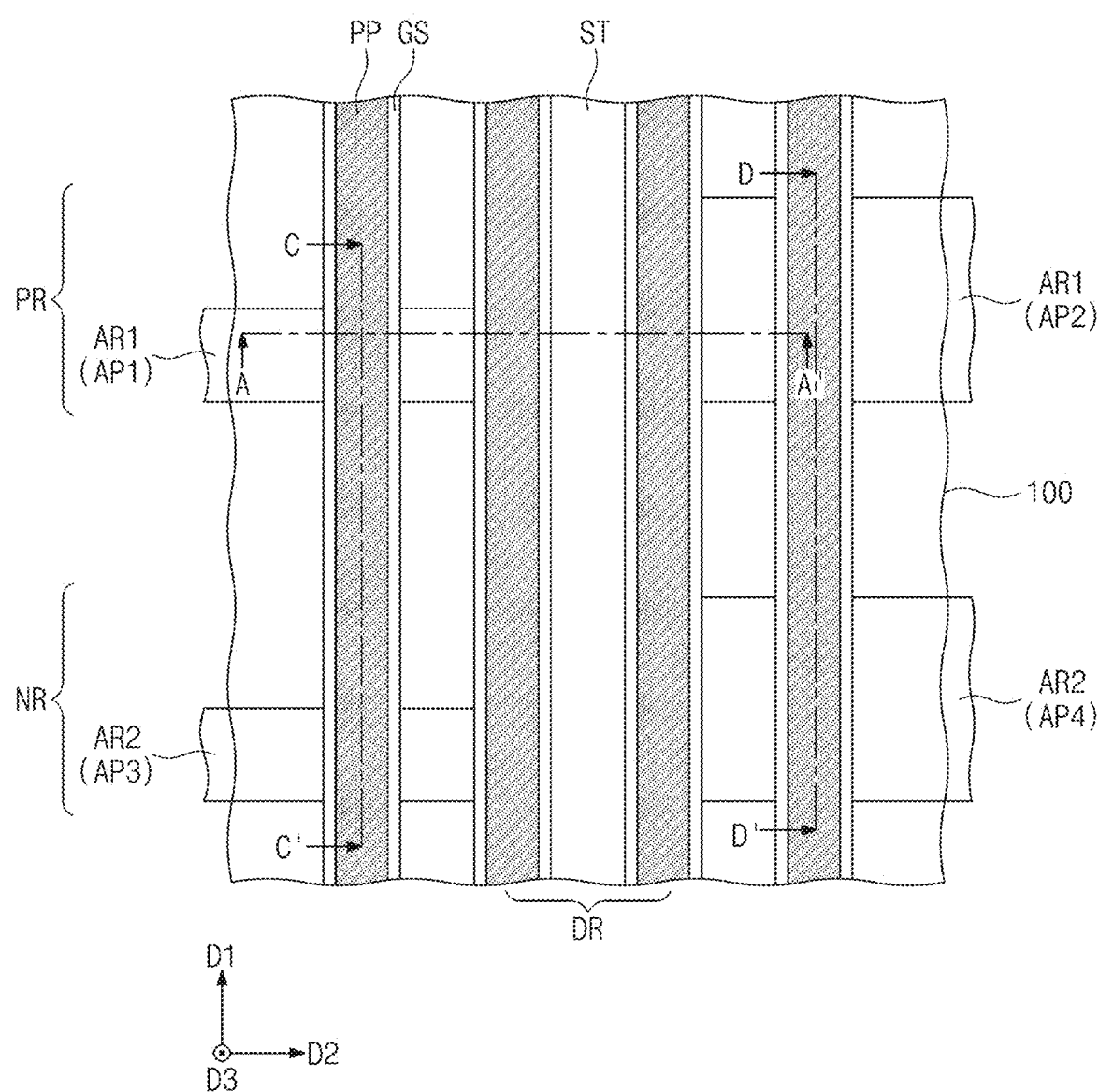
Figure 8A:
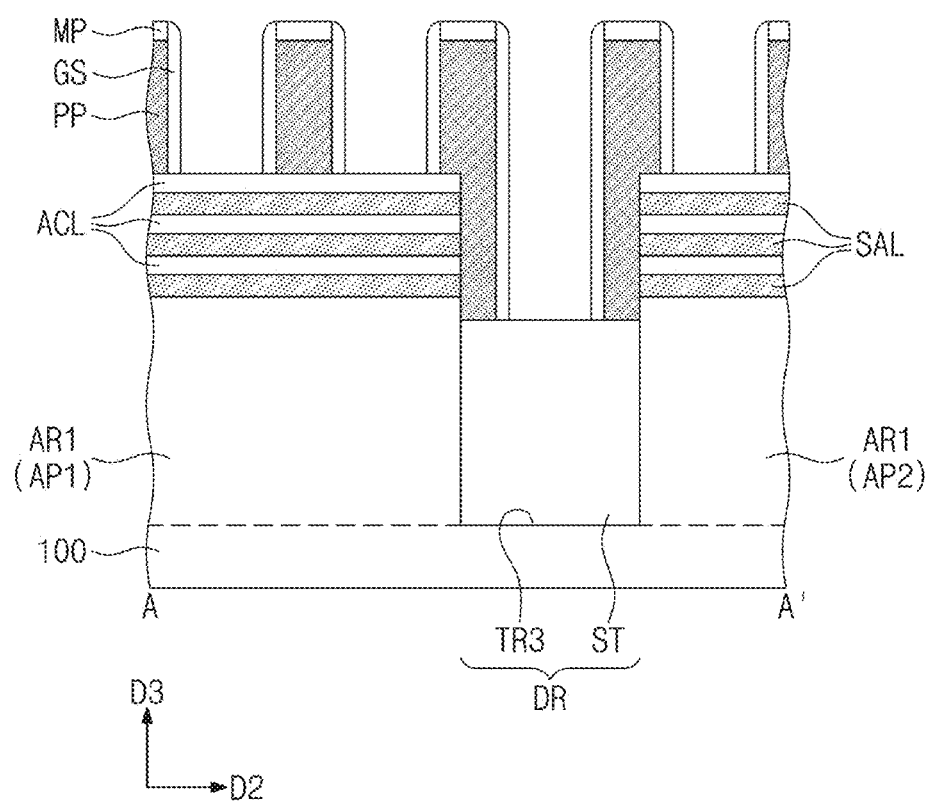
Figure 8B:
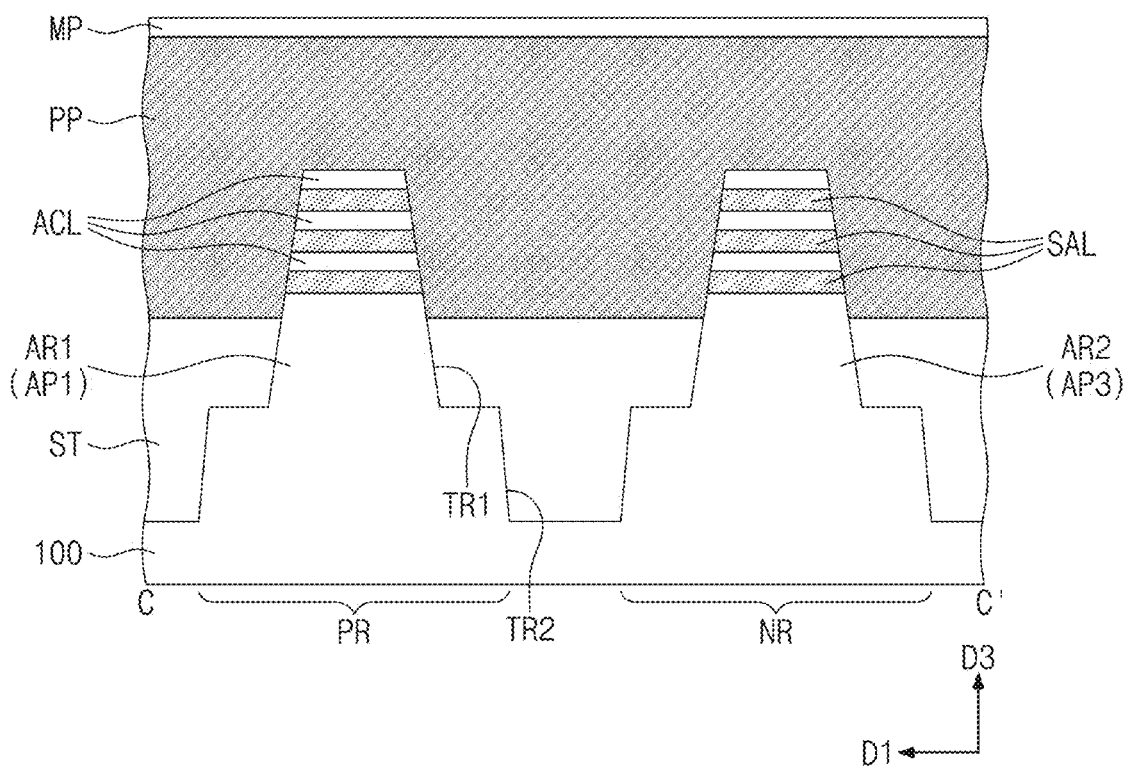
FIGS. 8B, 10C, 13C, 15C, and 17C are sectional views, which are taken along the line C-C' of FIG. 1 to illustrate a method of fabricating a semiconductor device, according to an example embodiment of the inventive concepts.
Figure 8C:
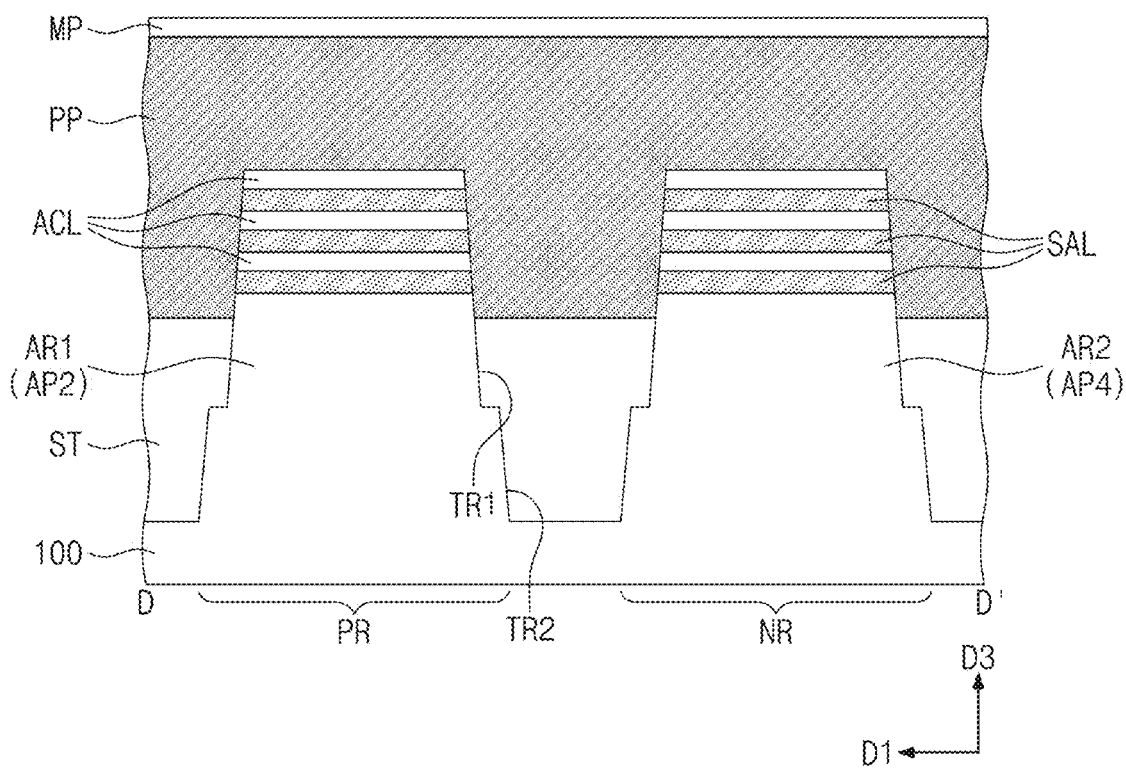
FIGS. 8C, 10D, 13D, 15D, and 17D are sectional views, which are taken along the line D-D' of FIG. 1 to illustrate a method of fabricating a semiconductor device, according to an example embodiment of the inventive concepts.
Figure 9:
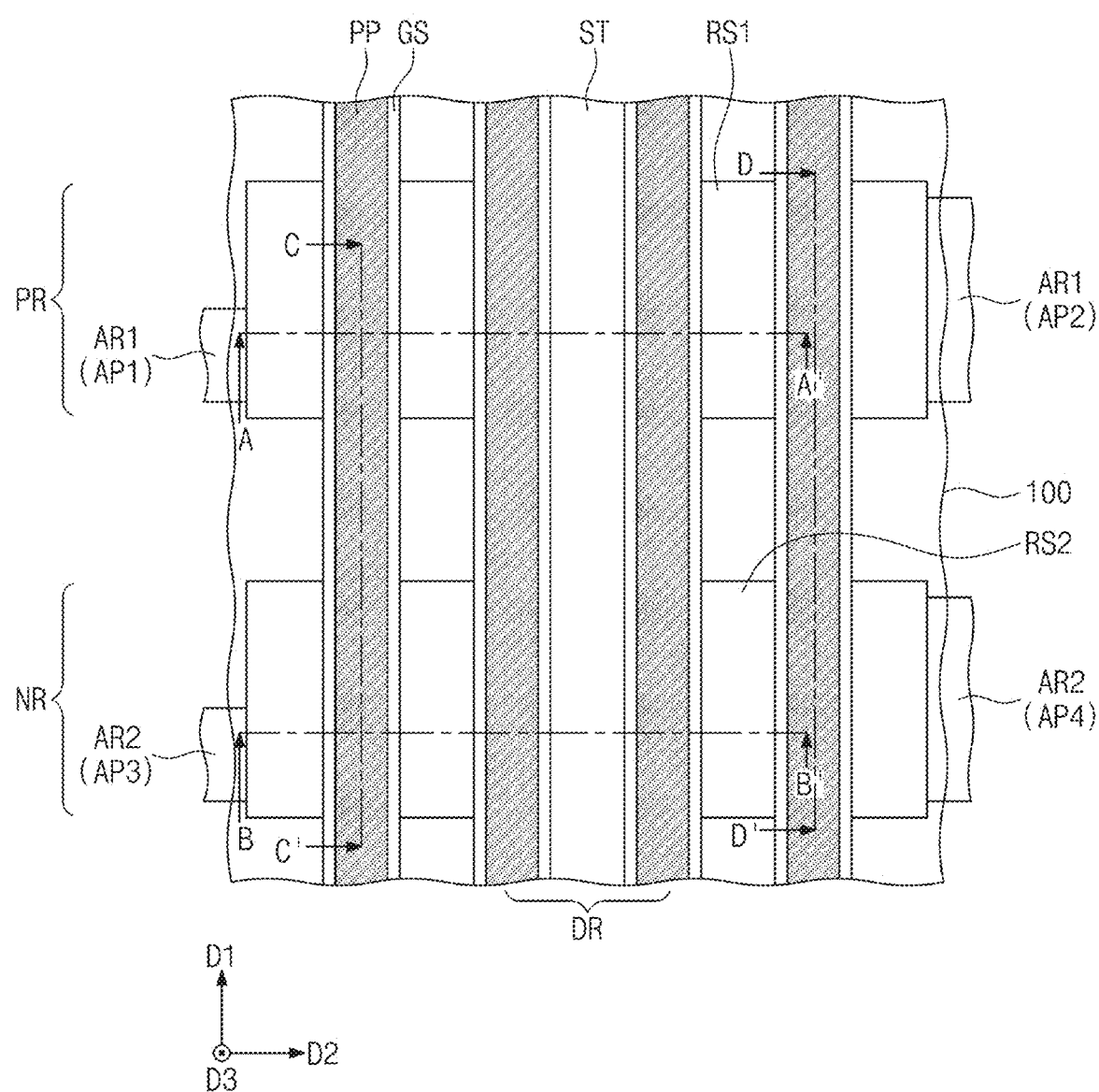
Figure 10A:
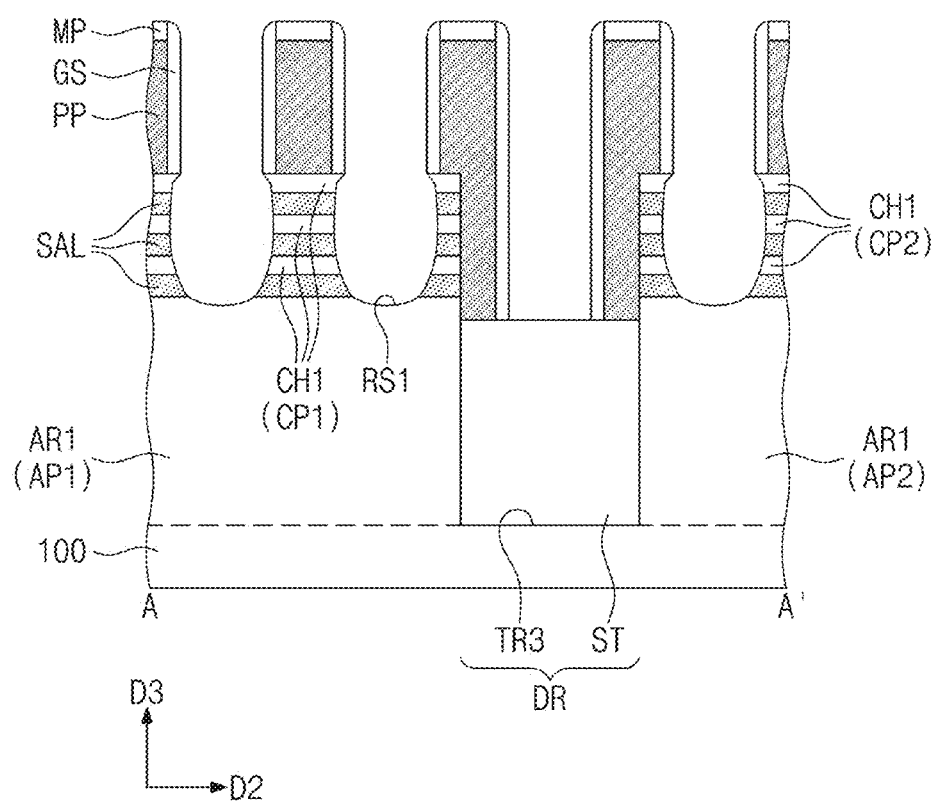
Figure 10B:
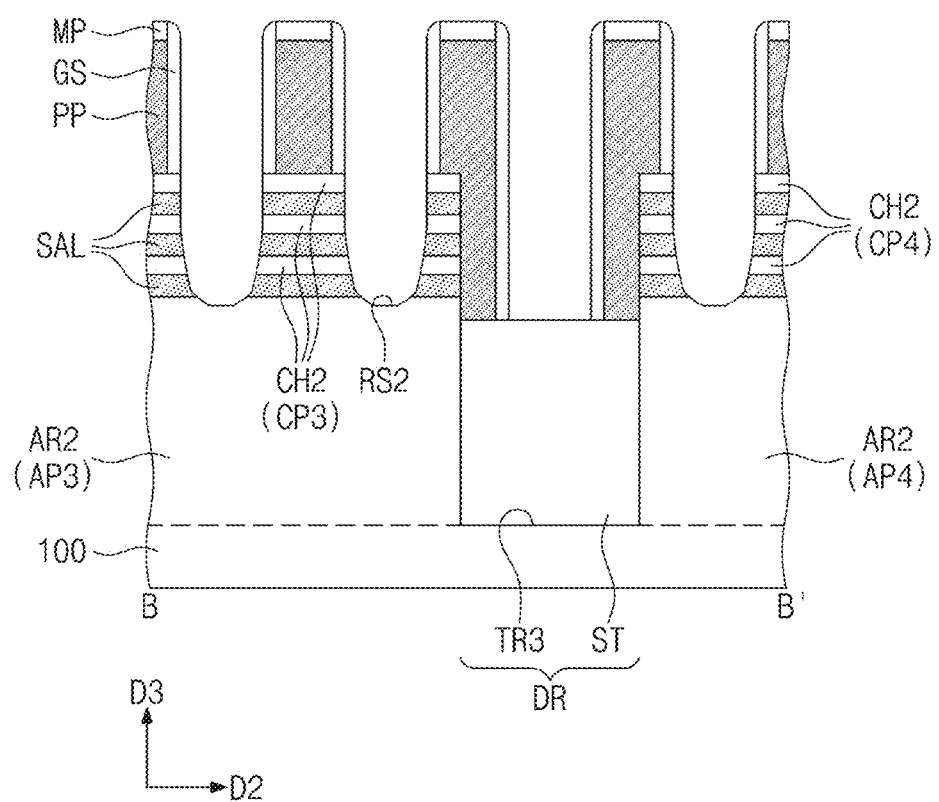
FIGS. 10B, 12B, 13B, 15B, and 17B are sectional views, which are taken along the line B-B' of FIG. 1 to illustrate a method of fabricating a semiconductor device, according to an example embodiment of the inventive concepts.
Figure 10C:
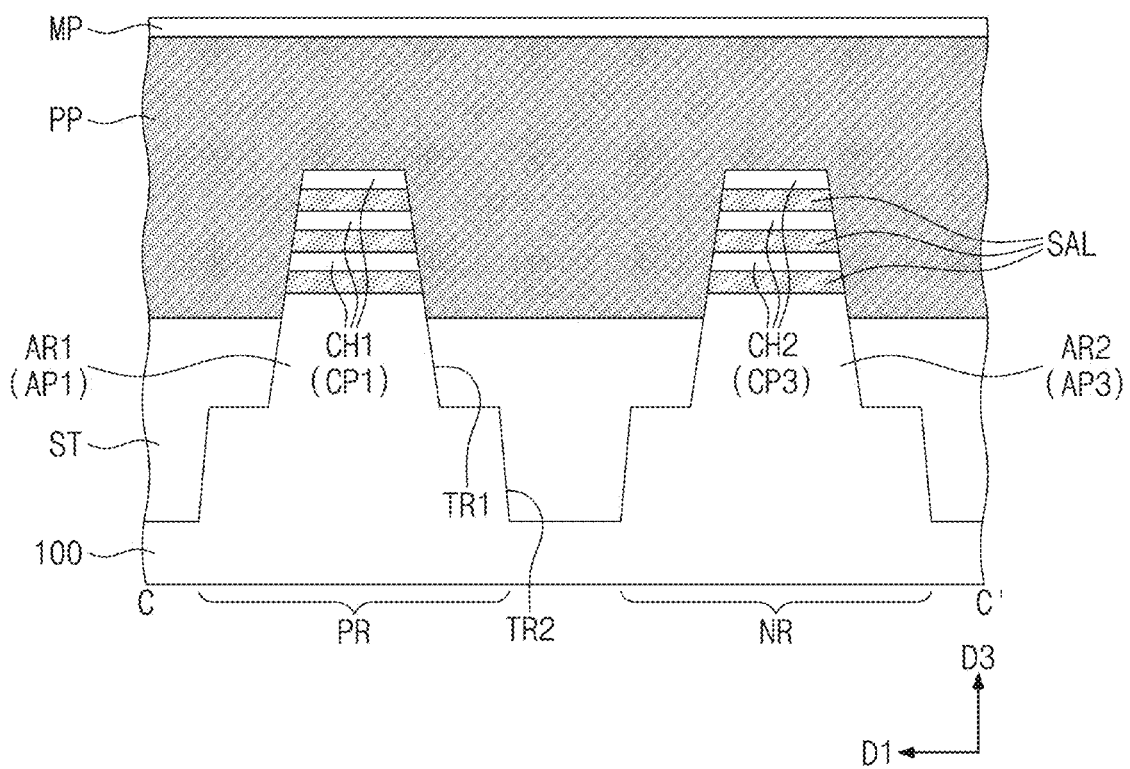
Figure 10D:
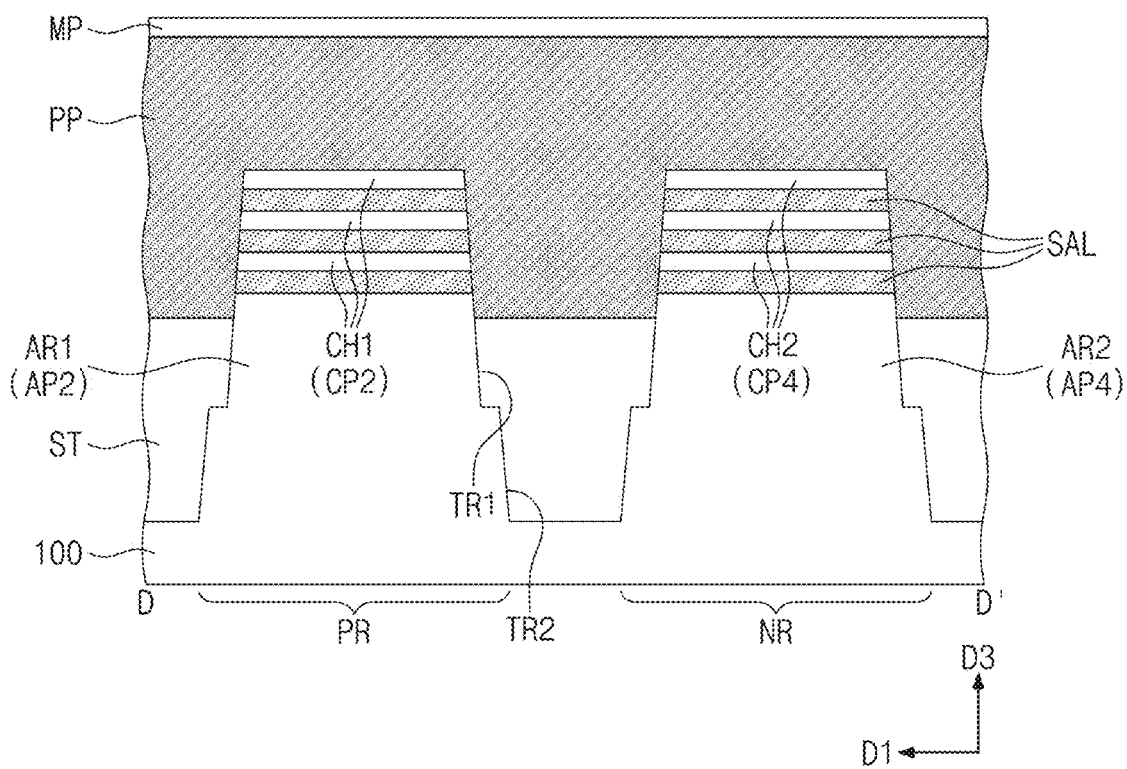

Referring to FIG. 4, the substrate 100 including the first and second cell regions PR and NR may be provided.

Sacrificial layers SAL and active layers ACL may be alternately and repeatedly stacked on the substrate 100. The sacrificial layers SAL may be formed of or include at least one of silicon (Si), germanium (Ge), or silicon-germanium (SiGe), and the active layers ACL may be formed of or include one, which is selected from silicon (Si), germanium (Ge), or silicon-germanium (SiGe) and is different from the sacrificial layers SAL. For example, the sacrificial layers SAL may be formed of or include silicon germanium (SiGe), and the active layers ACL may be formed of or include silicon (Si). Although FIG. 4 shows an example in which three active layers ACL are repeatedly stacked, but the inventive concepts are not limited to this example.

Referring to FIGS. 5A, 5B, 5C, 5D, and 6, a first patterning process may be performed on the substrate 100 to form the first trench TR1 defining the first and second active regions AR1 and AR2. As a result of the first patterning process, each of the first and second active regions AR1 and AR2 may include the sacrificial layers SAL and the active layers ACL, which are alternately stacked in its upper portion.

A second patterning process may be performed on the substrate 100 to form the second trench TR2 defining the first and second cell regions PR and NR. The second trench TR2 may be formed to be deeper than the first trench TR1.

A third patterning process may be performed on the substrate 100 to form the third trench TR3 dividing the first active region AR1 into the first and second active patterns AP1 and AP2 and dividing the second active region AR2 into the third and fourth active patterns AP3 and AP4. The third trench TR3 may be extended in the first direction D1 and may be formed on the division region DR defining a boundary between the logic cells. A width of the first active pattern AP1 in the first direction D1 may be smaller than a width of the second active pattern AP2 in the first direction D1. For example, a width of the first active region AR1, which is measured on the division region DR and in the first direction D1, may gradually increase in the second direction D2. A width of the third active pattern AP3 in the first direction D1 may be smaller than a width of the fourth active pattern AP4 in the first direction D1. For example, a width of the second active region AR2, which is measured on the division region DR and in the first direction D1, may gradually increase in the second direction D2.

The device isolation layer ST may be formed on the substrate 100 to fill the first to third trenches TR1, TR2, and TR3. For example, the formation of the device isolation layer ST may include forming an insulating layer on the substrate 100 and recessing the insulating layer to expose the sacrificial layers SAL. Accordingly, an upper portion of each of the first and second active regions AR1 and AR2 may protrude above the device isolation layer ST in a vertical direction. The device isolation layer ST may be formed of or include at least one of insulating materials (e.g., silicon oxide). Hereinafter, for the sake of brevity, subsequent steps of the fabrication method will be described based on the example embodiment of FIG. 5A. However, the steps to be described below may be applied to the example embodiments of FIGS. 5B, 5C, and 5D in the same manner.

Referring to FIGS. 7, 8A, 8B, and 8C, sacrificial patterns PP may be formed on the substrate 100 to cross the first and second active regions AR1 and AR2. The sacrificial patterns PP may be formed to have a line or bar shape extending in the first direction D1. For example, the formation of the sacrificial patterns PP may include forming a sacrificial layer on the substrate 100, forming mask patterns MP on the sacrificial layer, and patterning the sacrificial layer using the mask patterns MP as an etch mask. The sacrificial layer may be formed of or include poly silicon. The mask patterns MP may be formed of or include at least one of silicon oxide, silicon nitride, or silicon oxynitride.

Some of the sacrificial patterns PP on the division region DR may be extended downward toward the device isolation layer ST filling the third trench TR3. In other words, some of the sacrificial patterns PP may cover side surfaces of the sacrificial and active layers SAL and ACL, which are exposed by the third trench TR3. Some of the sacrificial patterns PP on the division region DR may cover a portion of the top surface of the device isolation layer ST filling the third trench TR3.

The gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. In some example embodiments, the gate spacer layer may be a multi-layered structure including at least two of SiCN, SiCON, or SiN.

The gate spacer GS on the division region DR may be extended downward along the side surface of the sacrificial pattern PP, which is adjacent to the division region DR, toward the device isolation layer ST filling the third trench TR3. The gate spacer GS on the division region DR may cover a portion of the top surface of the device isolation layer ST filling the third trench TR3.

Referring to FIGS. 9, 10A, 10B, 10C, and 10D, the first recesses RS1 may be formed in an upper portion of the first active region AR1. For example, the first recesses RS1 may be formed by etching the upper portion of the first active region AR1 using the mask patterns MP and the gate spacers GS as an etch mask. The first recess RS1 may be formed between the sacrificial patterns PP. The second recesses RS2 may be formed in an upper portion of the second active region AR2. The second recesses RS2 may be formed by etching the upper portion of the second active region AR2 using the mask patterns MP and the gate spacers GS as an etch mask. The second recesses RS2 may be formed between the sacrificial patterns PP.

Figure 11:
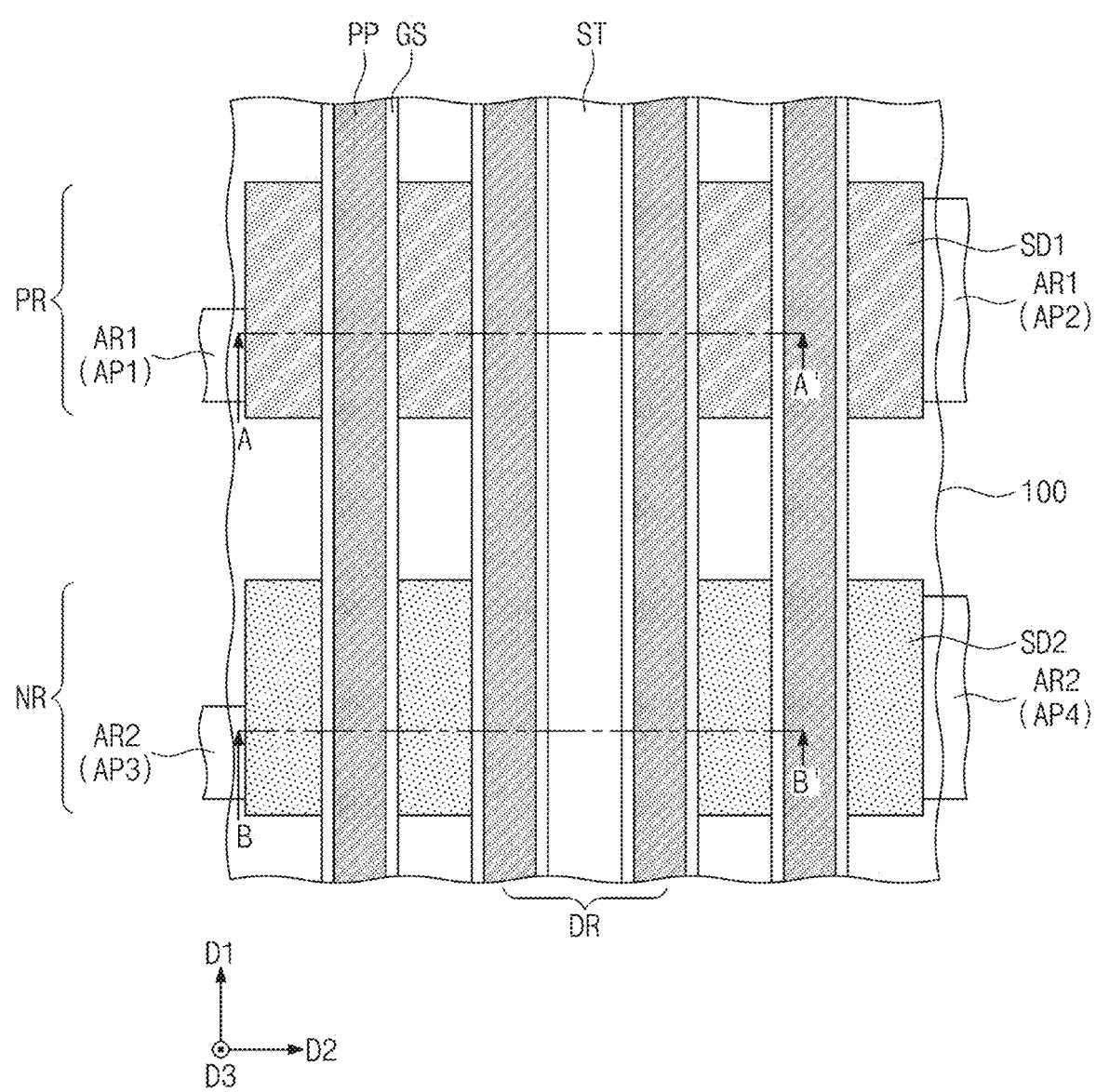
Figure 12A:
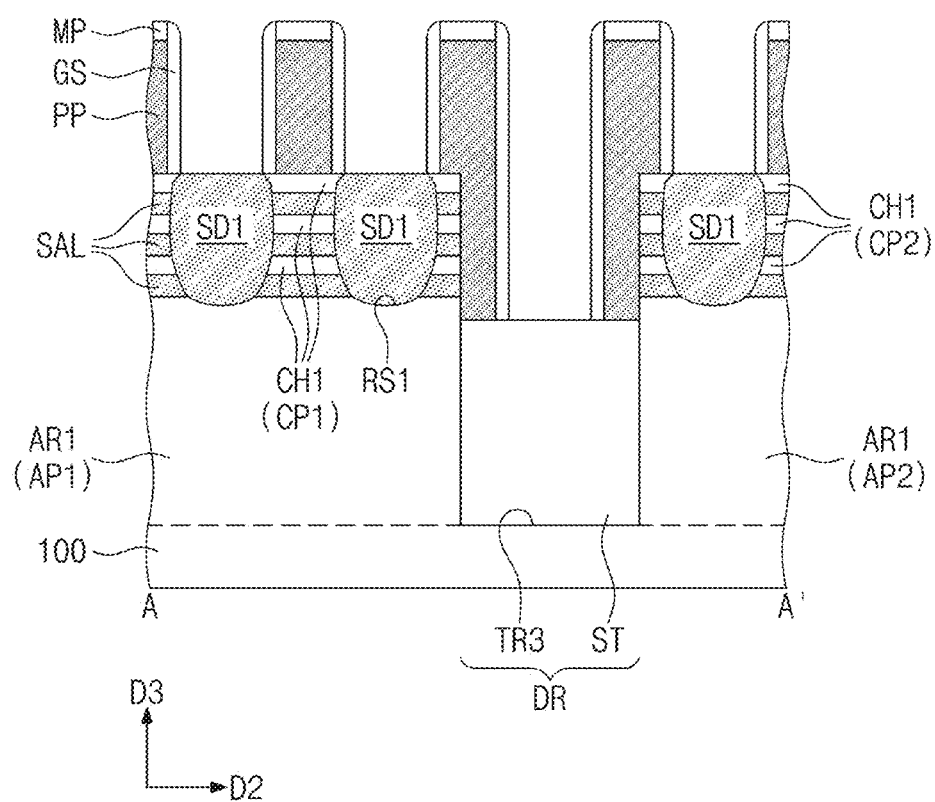
Figure 12B:
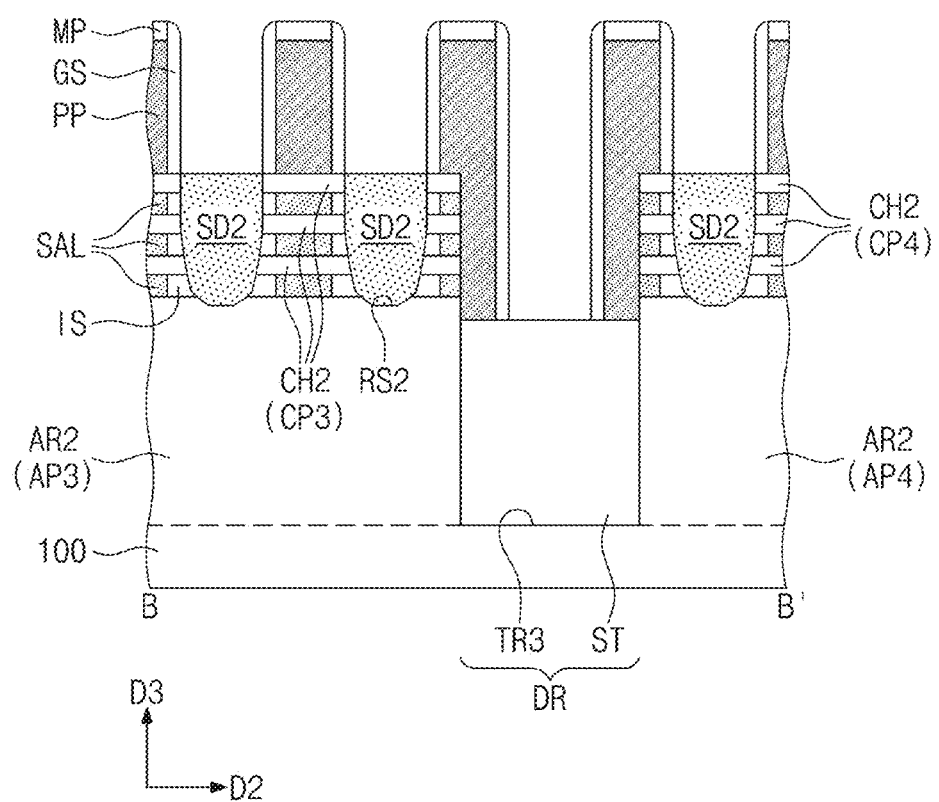
Figure 13A:
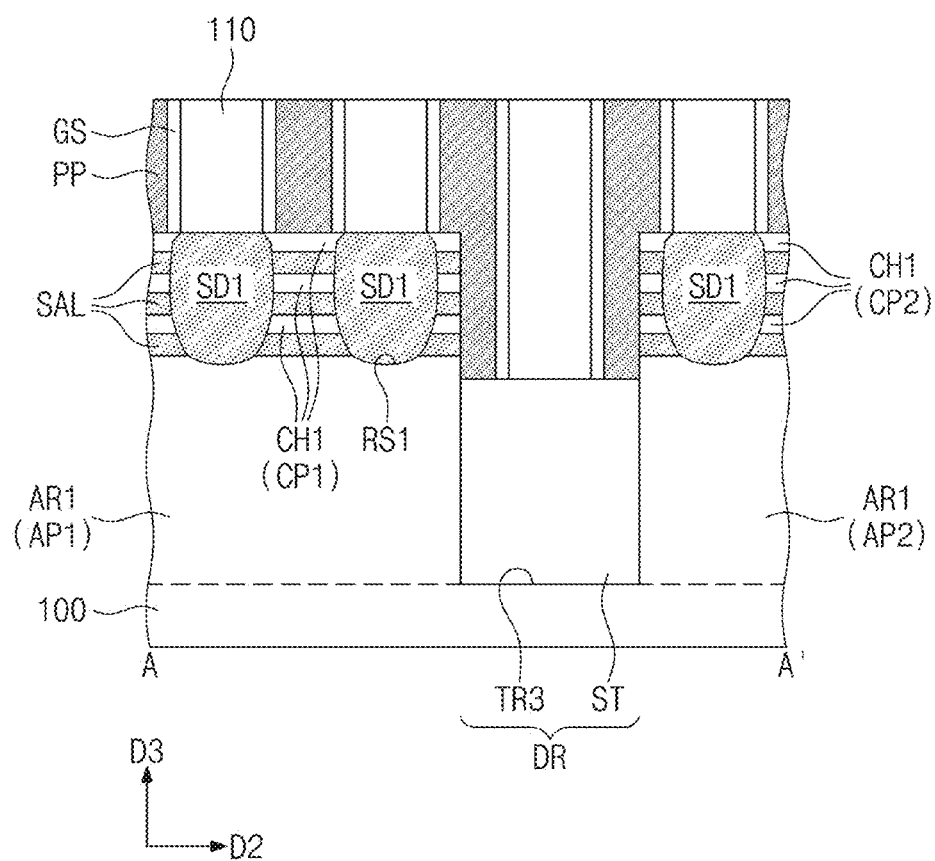
Figure 13B:
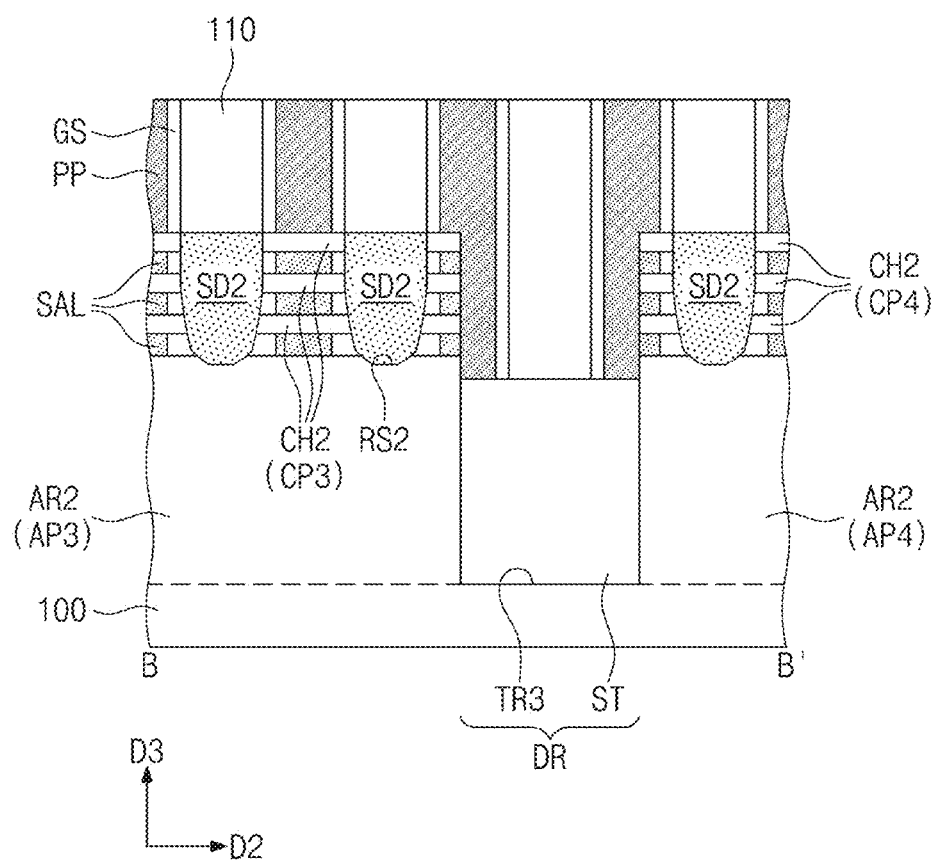
Figure 13C:
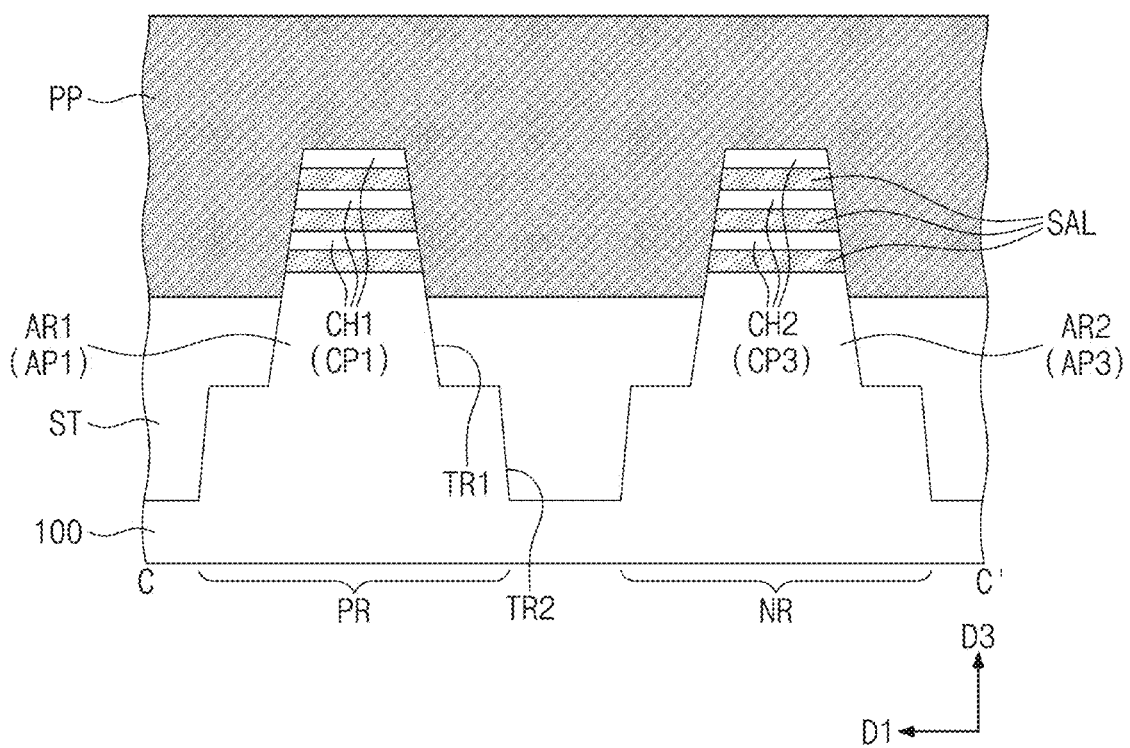
Figure 13D:
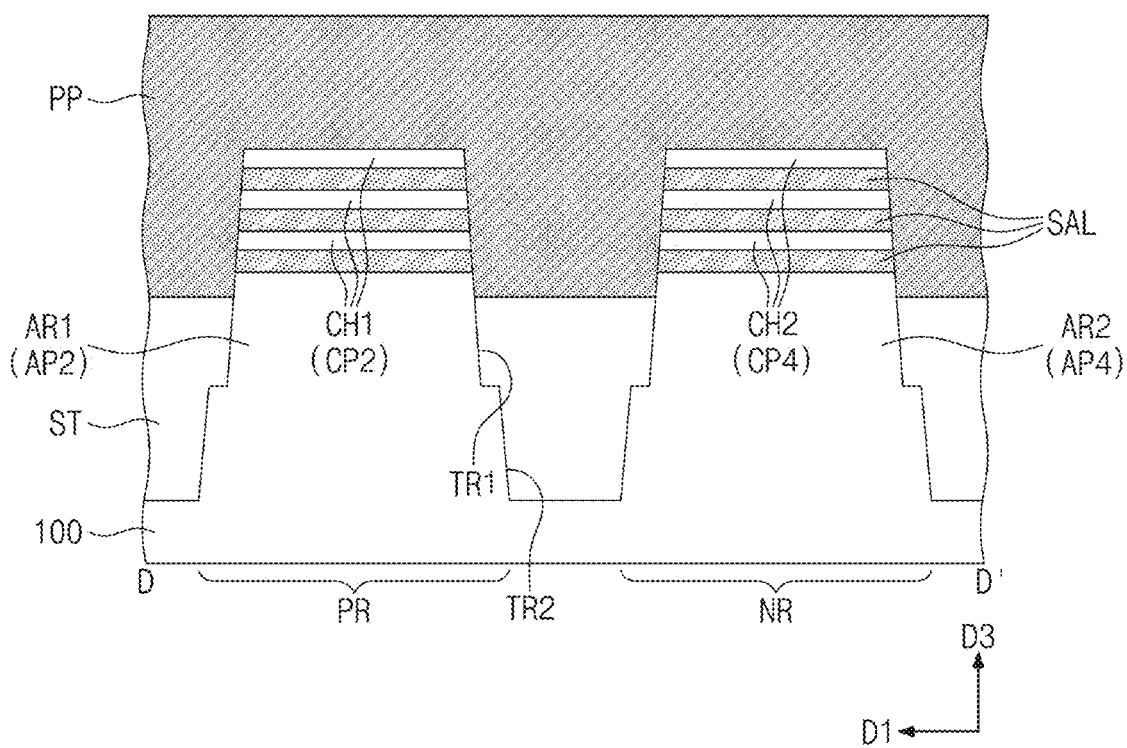
Figure 14:
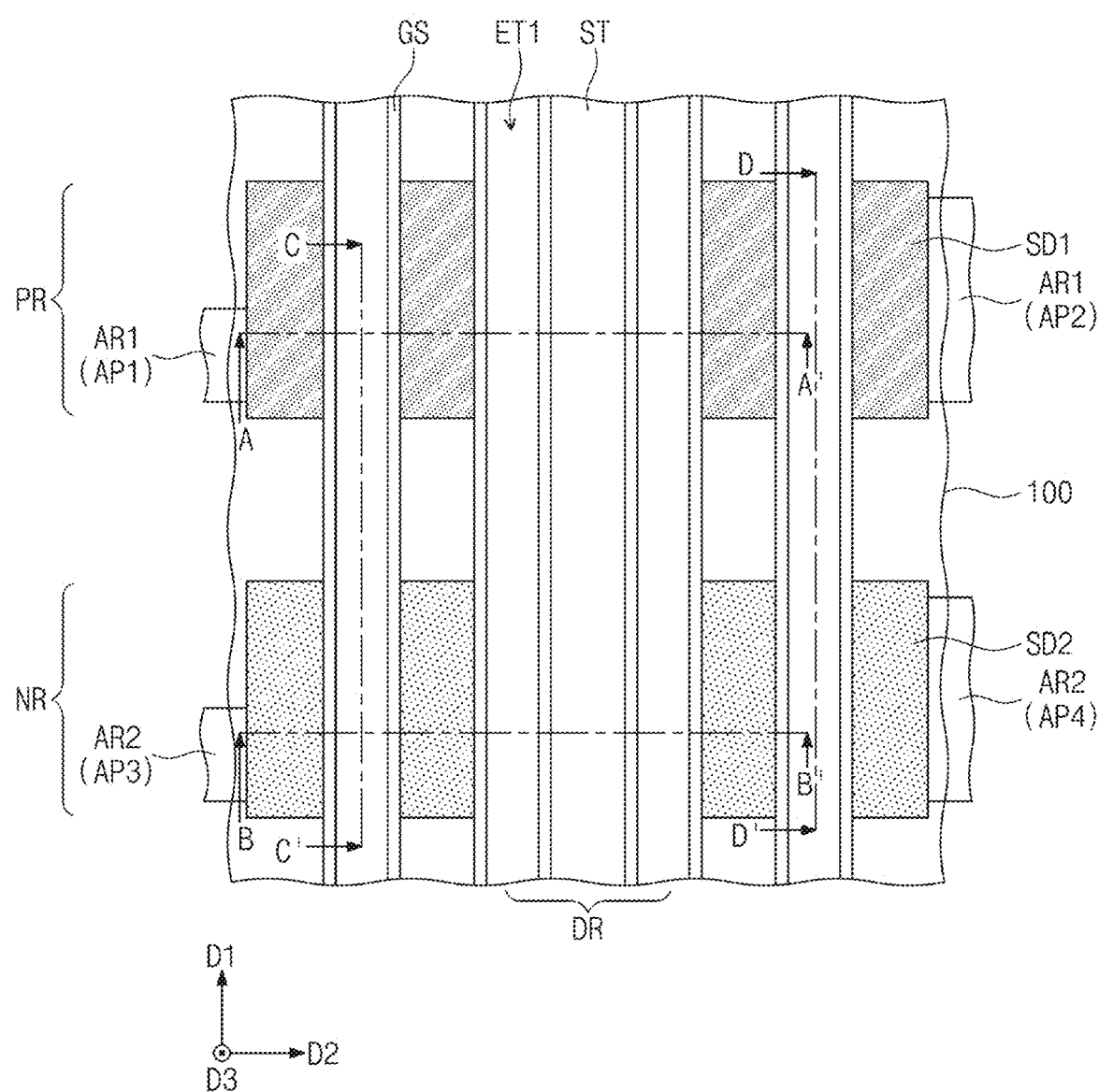
Figure 15A:
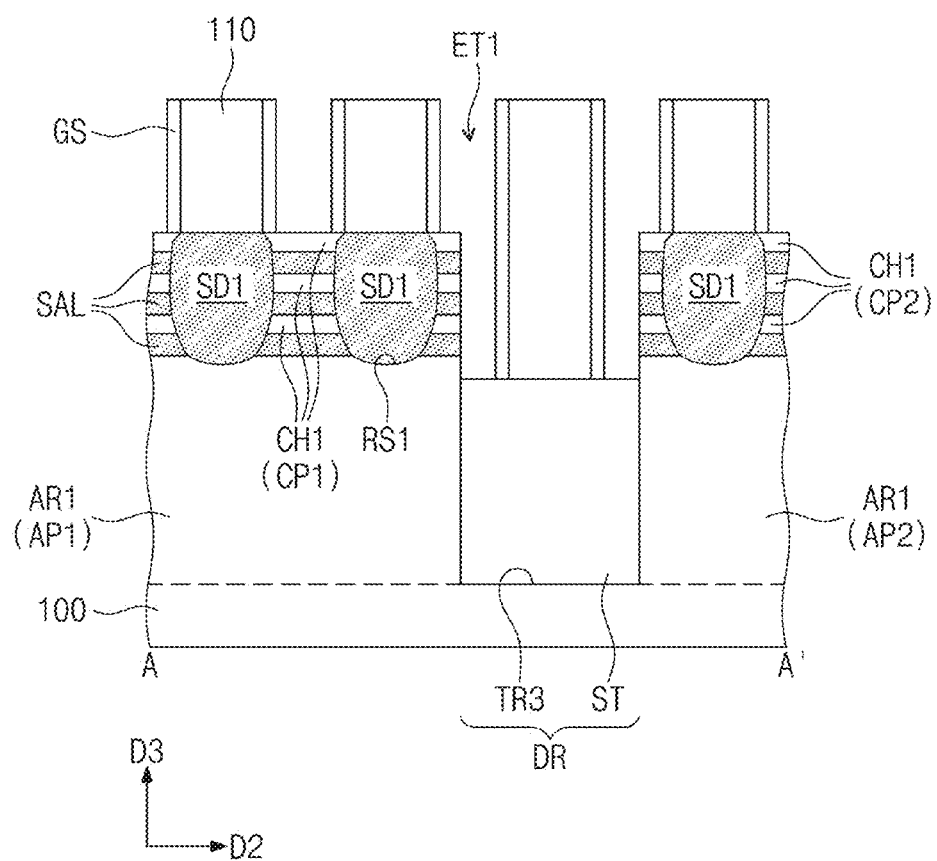
Figure 15B:
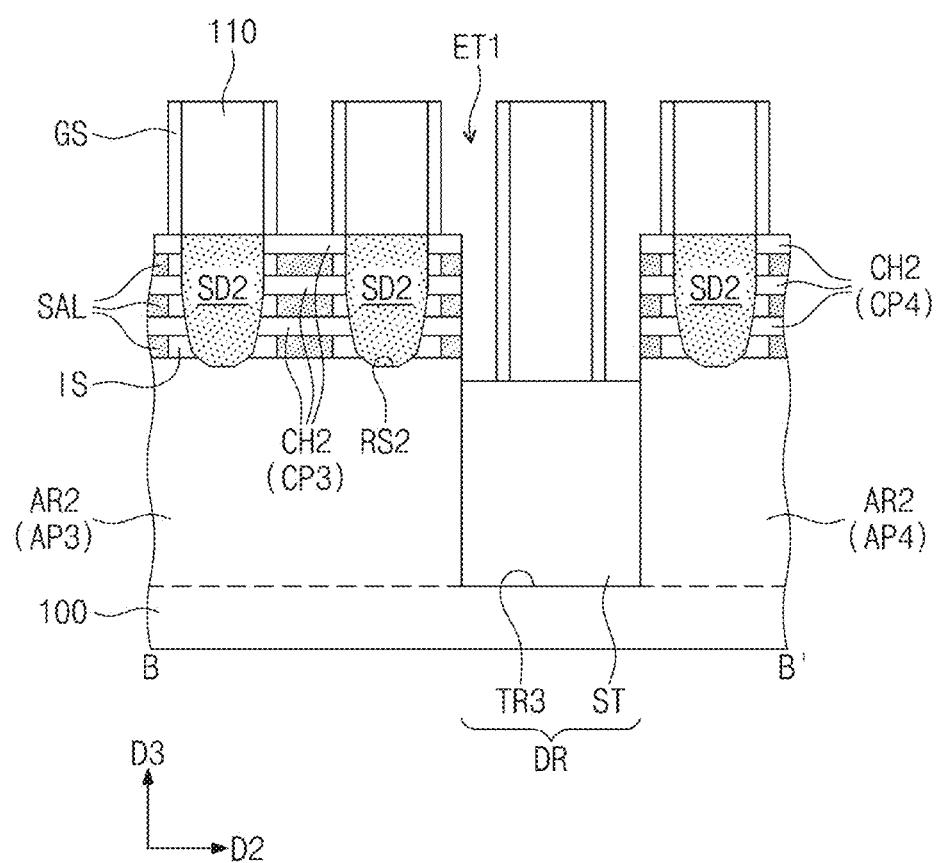
Figure 15C:
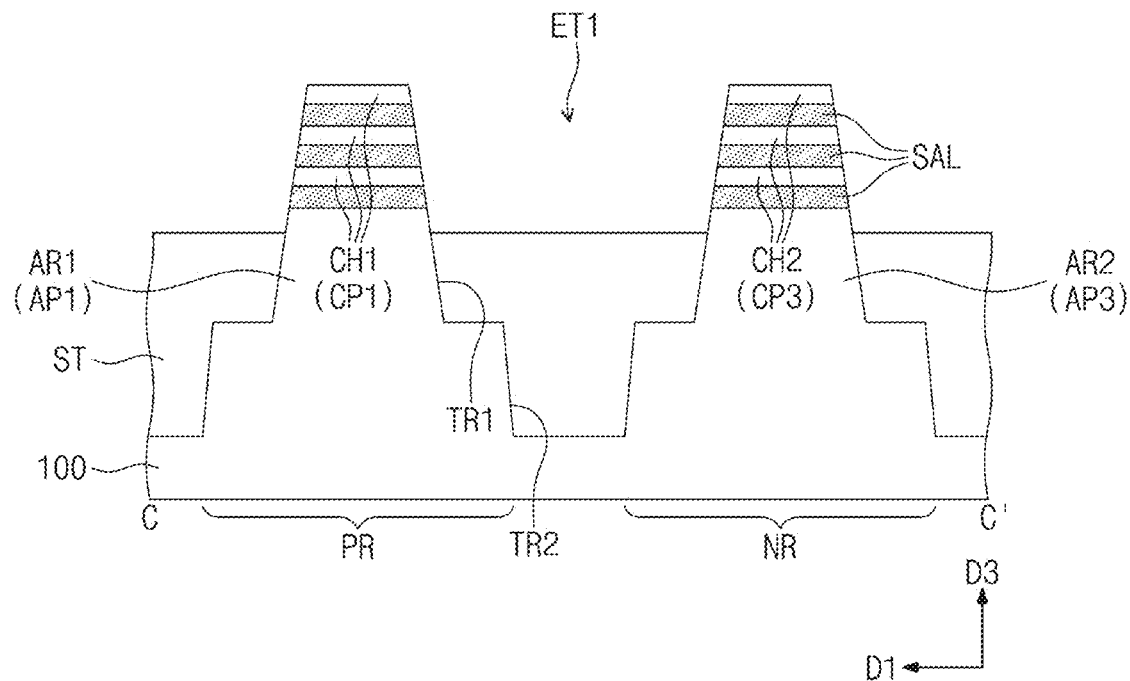
Figure 15D:
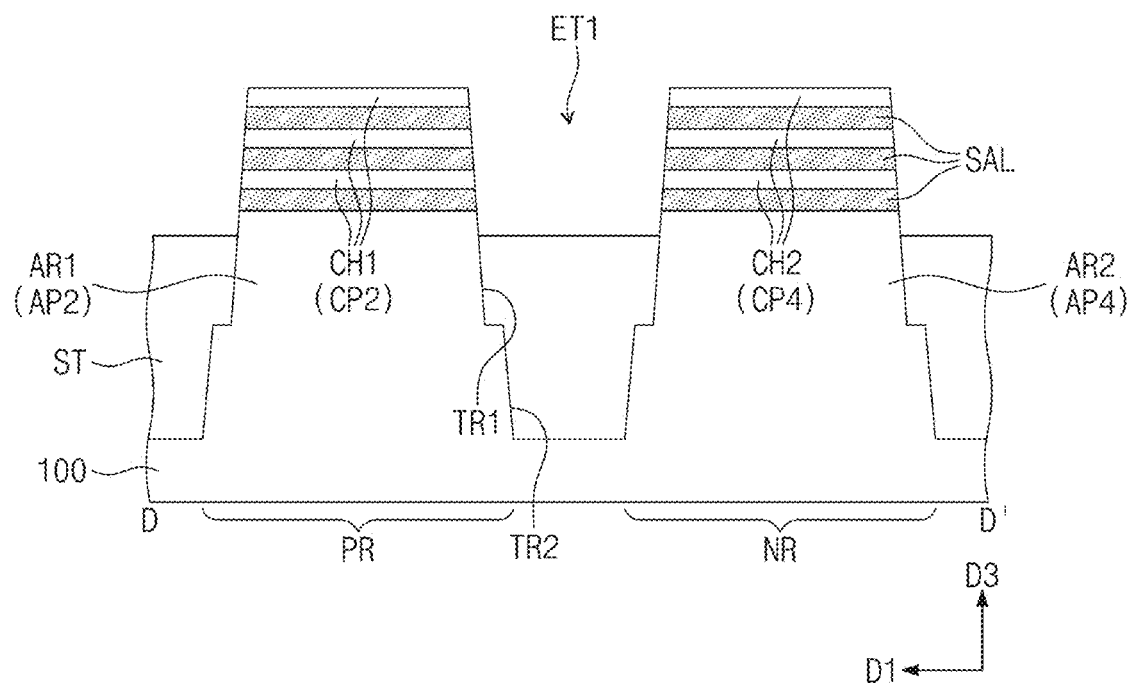
Figure 16:
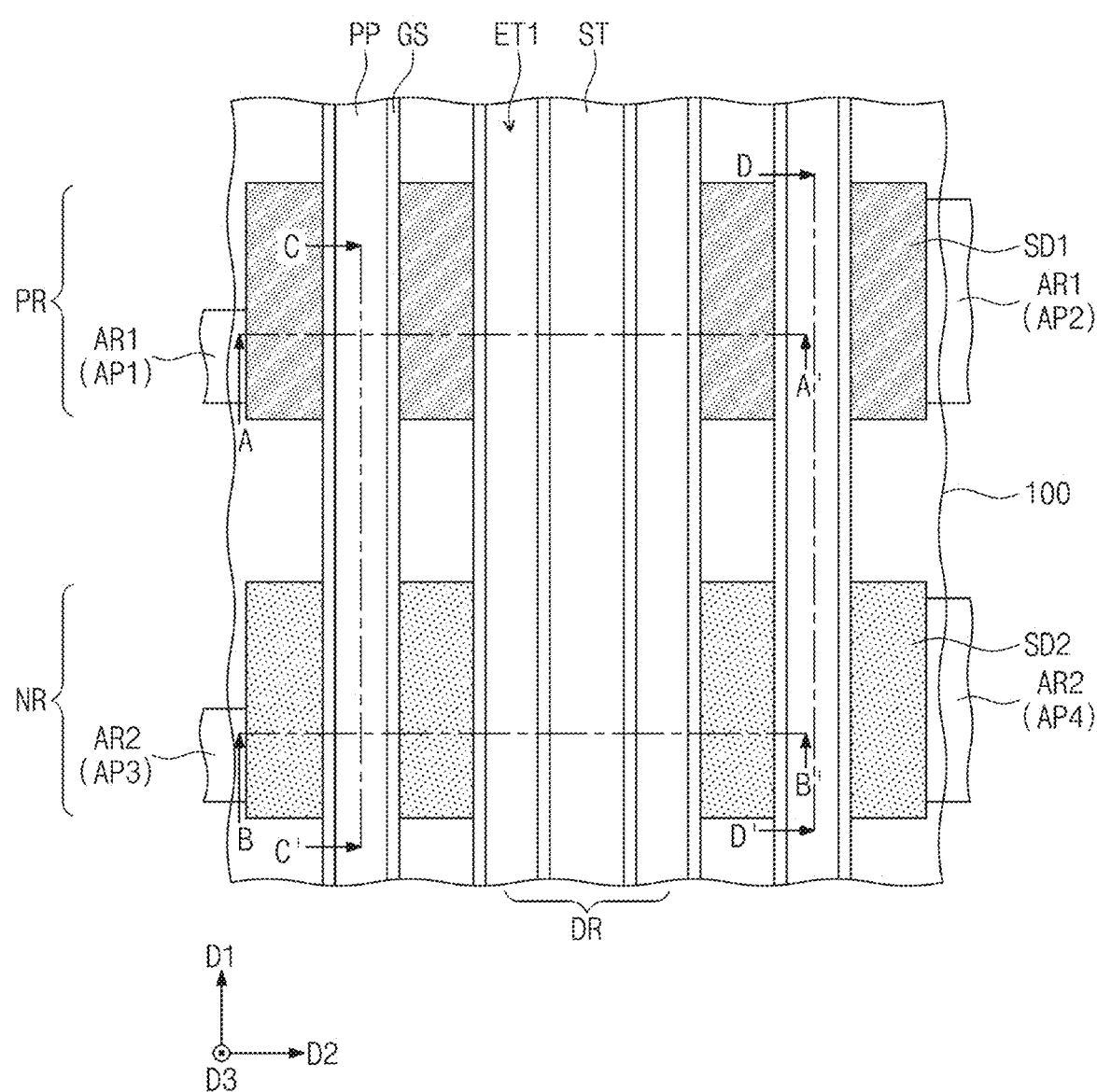
Figure 17A:
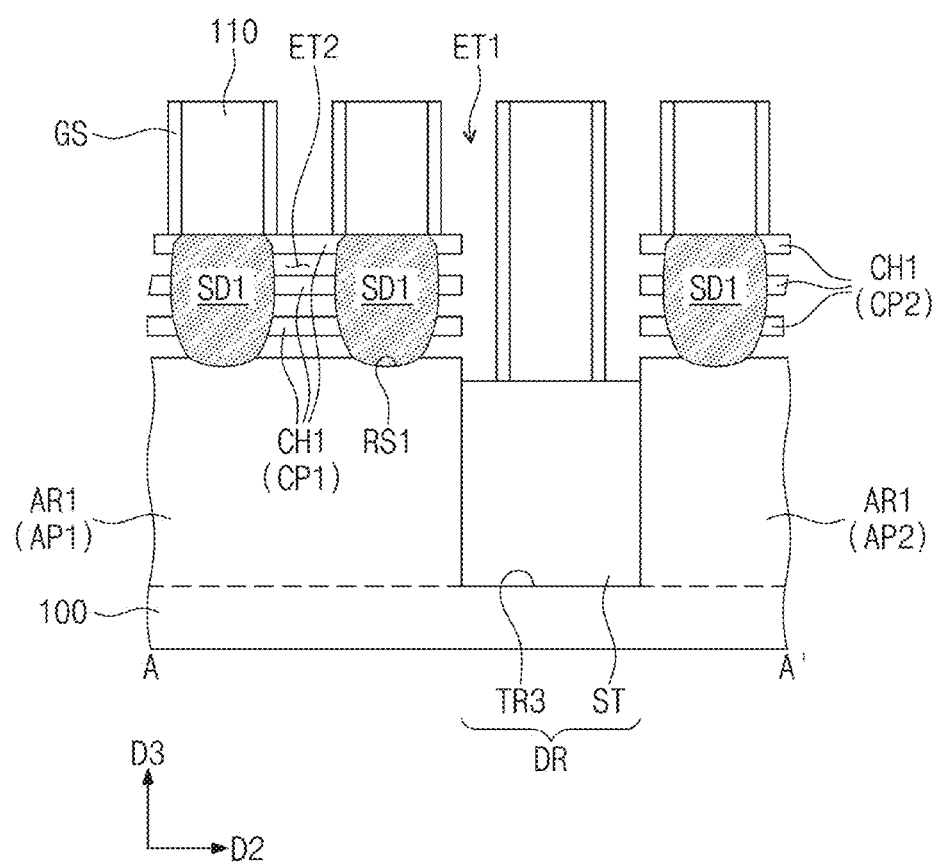
Figure 17B:
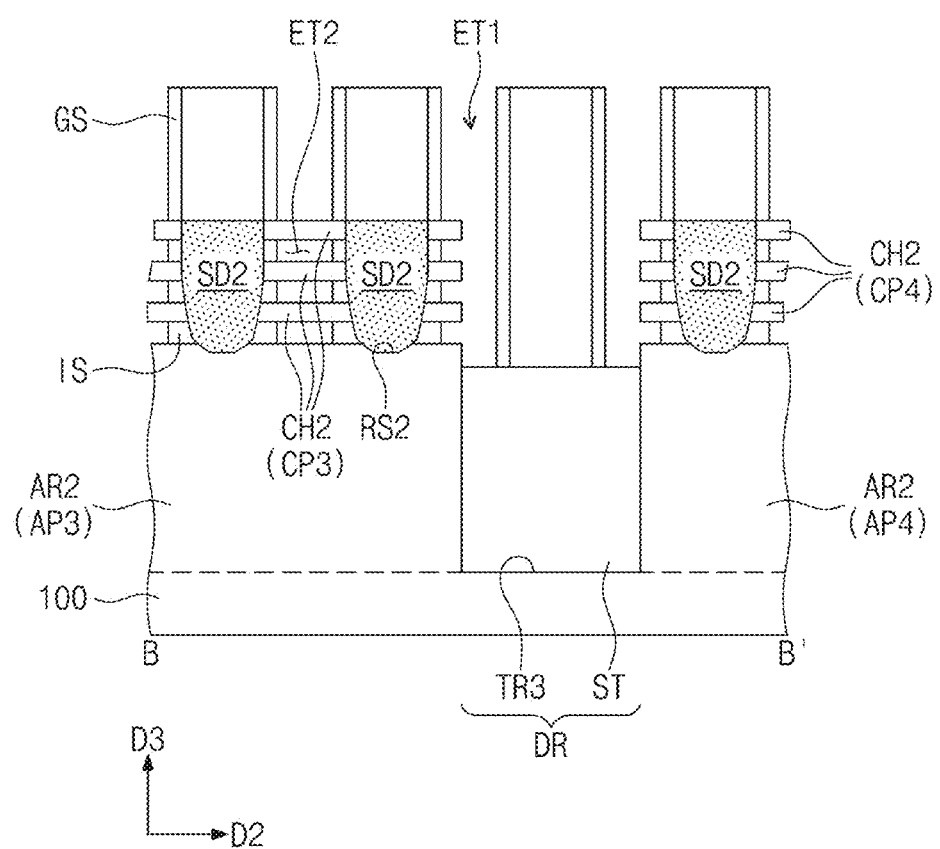
Figure 17C:
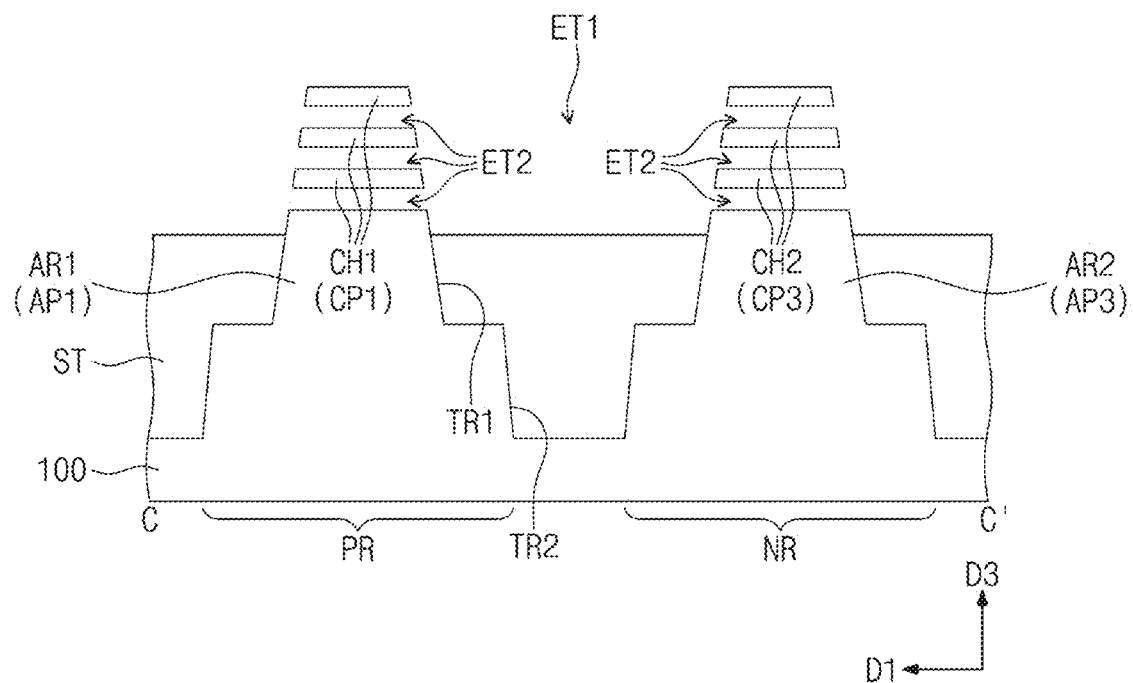
Figure 17D:
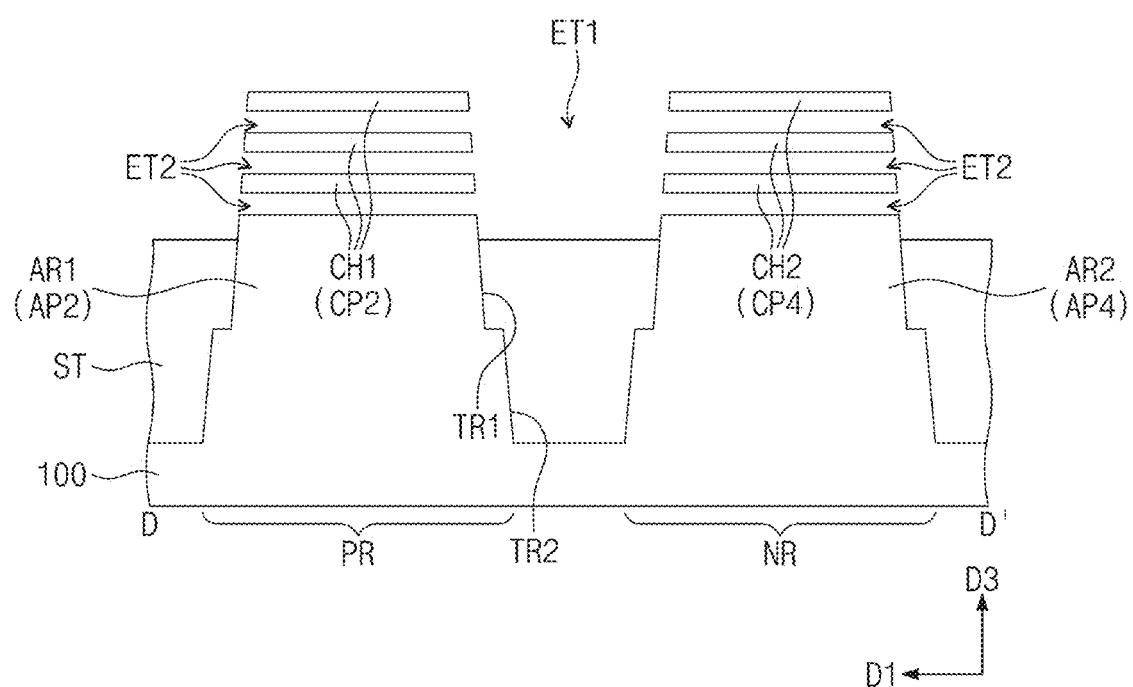

Referring to FIGS. 11, 12A, and 12B, portions of the sacrificial layers SAL on the second cell region NR may be removed, and then the inner spacers IS may be formed. For example, the formation of the inner spacers IS may include conformally forming an insulating layer to fill regions, which are formed by removing the portions of the sacrificial layers SAL on the second cell region NR, and isotropically etching a portion of the insulating layer. In an example embodiment, the insulating layer may include a silicon nitride layer.

The first source/drain patterns SD1 may be formed in the first recesses RS1, respectively. The formation of the first source/drain patterns SD1 may include performing a selective epitaxial process using an inner surface of the first recess RS1 as a seed layer. For example, the selective epitaxial process may include a chemical vapor deposition (CVD) process or a molecular beam epitaxy (MBE) process.

As an example, the first source/drain patterns SD1 may be formed of a semiconductor material (e.g., SiGe) whose lattice constant is larger than a lattice constant of the semiconductor material of the substrate 100. The first source/drain patterns SD1 may be doped with p-type impurities during or after the selective epitaxial process.

The second source/drain patterns SD2 may be formed in the second recesses RS2, respectively. The formation of the second source/drain patterns SD2 may include performing a selective epitaxial process using the inner surface of the second recess RS2 as a seed layer. As an example, the second source/drain patterns SD2 may be formed of or include the same semiconductor material (e.g., Si) as the substrate 100. The second source/drain patterns SD2 may be doped with n-type impurities during or after the selective epitaxial process.

Referring to FIGS. 13A, 13B, 13C, and 13D, the first interlayer insulating layer 110 may be formed to cover the first and second source/drain patterns SD1 and SD2, the mask patterns MP, and the gate spacers GS. As an example, the first interlayer insulating layer 110 may include a silicon oxide layer. The first interlayer insulating layer 110, which is formed on the division region DR, may be extended downward toward the device isolation layer ST filling the third trench TR3. In other words, the first interlayer insulating layer 110, which is formed on the division region DR, may cover a portion of the top surface of the device isolation layer ST filling the third trench TR3.

The first interlayer insulating layer 110 may be planarized until top surfaces of the sacrificial patterns PP are exposed. The planarization process on the first interlayer insulating layer 110 may be performed using an etch-back or chemical mechanical polishing (CMP) process. All of the mask patterns MP may be removed during the planarization process. As a result, the first interlayer insulating layer 110 may have a top surface that is coplanar with the top surfaces of the sacrificial patterns PP and the top surfaces of the gate spacers GS.

Referring to FIGS. 14, 15A, 15B, 15C, and 15D, the exposed sacrificial patterns PP may be selectively removed. As a result of the removal of the sacrificial patterns PP, a first empty space ET1 may be formed between adjacent ones of the gate spacers GS. The first empty space ET1 may expose the first and second channel layers CH1 and CH2 and the sacrificial layers SAL. The first empty space ET1 on the division region DR may expose a portion of the top surface of the device isolation layer ST filling the third trench TR3. Further, the first empty space ET1 on the division region DR may expose the side surfaces of the first and second channel layers CH1 and CH2 and the sacrificial layers SAL, which are exposed through the third trench TR3.

The sacrificial layers SAL, which are exposed through the first empty space ET1, may be selectively removed. For example, an etching process may be performed to selectively etch the sacrificial layers SAL, and in this case, only the sacrificial layers SAL may be removed without removal of the first and second channel layers CH1 and CH2.

Referring to FIGS. 16, 17A, 17B, 17C, and 17D, because the sacrificial layers SAL are selectively removed, the first and second channel layers CH1 and CH2 may be left on the first and second active regions AR1 and AR2, respectively. Regions, which are formed by removing the sacrificial layers SAL, will be referred to as second empty spaces ET2. The second empty spaces ET2 may be defined between the first channel layers CH1 and between the second channel layers CH2.

Referring back to FIGS. 1 and 2A to 2D, the gate insulating layer GI may be conformally formed in the first and second empty spaces ET1 and ET2. The gate insulating layer GI may be formed to cover a portion of a top surface of the device isolation layer ST, which is located on the division region DR and below the gate electrode GEd. The gate insulating layer GI on the division region DR may be formed to cover a side surface of each of the first and second channel layers CH1 and CH2 adjacent to the division region DR. For example, the gate insulating layer GI may include a silicon oxide layer, a silicon oxynitride layer, and/or a high-k dielectric layer. As an example, the high-k dielectric layer may be formed of or include a high-k dielectric material whose dielectric constant is higher than a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may be formed on the gate insulating layer GI. The gate electrode GE may be formed to fill the first and second empty spaces ET1 and ET2. As an example, the gate electrode GE may be formed of or include at least one of conductive metal nitrides (e.g., titanium nitride or tantalum nitride) or metallic materials (e.g., titanium, tantalum, tungsten, copper, or aluminum). The gate electrodes GE may include the dummy gate electrodes GEd. The dummy gate electrodes GEd may be formed adjacent to the division region DR. The dummy gate electrodes GEd may include portions that are extended into regions, which are provided between the first and second channel layers CH1 and CH2 and adjacent to the division region DR. The dummy gate electrodes GEd may further include other portions that are extended downward the device isolation layer ST filling the third trench TR3.

The gate capping pattern GP may be formed on the gate electrode GE. The gate capping pattern GP may be formed of or include at least one of SiON, SiCN, SiCON, or SiN.

The second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The third interlayer insulating layer 130 may be formed on the active contacts AC and the gate contacts GC. The first interconnection lines M1 may be formed in the third interlayer insulating layer 130.

In a semiconductor device according to an example embodiment of the inventive concepts, at least one of channel patterns, which are located adjacent to a division region and has a relatively small width, may include an end portion with a protruding portion. Accordingly, it may be possible to mitigate or prevent a short failure from occurring between a source/drain patterns and a gate electrode adjacent to the division region and thereby to improve performance and electric characteristics of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A method of manufacturing a semiconductor device, the method comprising:
   forming a first active region on a substrate;
   forming a division region extending in a first direction, the division region dividing the first active region into first and second active patterns, wherein the first and second active patterns are spaced apart in a second direction, and the second direction is perpendicular to the first direction; and
   forming a first channel pattern on the first active pattern and a second channel pattern on the second active pattern,
   wherein an end portion of the first active pattern adjacent to the division region comprises a protruding portion extending in the first direction, and
   the protruding portion has a triangle shape, when viewed in a plan view.

2. The method of claim 1, wherein the smallest width of the first active pattern in the first direction is smaller than the smallest width of the second active pattern in the first direction.

3. The method of claim 1, wherein a width of the first active region, which is measured on the division region and in the first direction, gradually increases in the second direction.

4. The method of claim 1, wherein when viewed in a plan view, a portion of the second active pattern adjacent to the division region has a square or rectangular shape.

5. The method of claim 1, further comprising,
   forming a device isolation layer on the division region after forming the division region;
   forming sacrificial patterns and gate spacers extending in the first direction on the first active region;
   forming first recesses in an upper portion of the first active region using the sacrificial patterns and the gate spacers as a mask; and
   forming first source/drain patterns in the first recesses.

6. The method of claim 5, further comprising:
   forming a first interlayer insulating layer covering the sacrificial patterns and the gate spacers,
   wherein the first interlayer insulating layer on the division region extends downward toward the device isolation layer.

7. The method of claim 5, further comprising:
   forming a gate insulating layer on the first and second channel patterns; and
   forming gate electrodes on the gate insulating layer,
   wherein the gate electrodes adjacent to the division region comprise portion that extends downward toward the device isolation layer.

8. The method of claim 5, wherein the protruding portion includes a hypotenuse inclined at an obtuse angle relative to a side of the first source/drain patterns crossing the first channel pattern.

9. The method of claim 1, wherein the end portion of the first channel pattern adjacent to the division region further comprises another protruding portion extending in a direction opposite to the first direction.

10. A method of manufacturing a semiconductor device, the method comprising:
    forming a first active region on a substrate;
    performing a first patterning process to form a first trench extending in a first direction, the first trench divides the first active region into first and second active patterns;
    forming a division region defined by the first trench, wherein the first and second active patterns are spaced apart in a second direction by the division region, and the second direction is perpendicular to the first direction;
    forming a device isolation layer filling the first trench on the division region; and forming a first channel pattern on the first active pattern and a second channel pattern on the second active pattern,
wherein a first width in the first direction of a side surface of the first channel pattern in contact with an inner side surface of the first trench is larger than a smallest width of the first channel pattern in the first direction, and
the first width is smaller than a smallest width of the second channel pattern in the first direction.

11. The method of claim 10, wherein the smallest width of the first active pattern in the first direction is smaller than the smallest width of the second active pattern in the first direction.

12. The method of claim 10, wherein a width of the first active region, which is measured on the division region and in the first direction, gradually increases in the second direction.

13. The method of claim 10, further comprising,
forming a first source/drain pattern in an upper portion of the first active region after forming the device isolation layer,
wherein an end portion of the first channel pattern adjacent to the division region comprises a protruding portion extending in the first direction, and
the protruding portion has a hypotenuse inclined at an obtuse angle relative to a side of the first source/drain pattern crossing the first channel pattern.

14. The method of claim 10, further comprising:
forming a gate insulating layer on the first and second channel patterns; and
forming gate electrodes on the gate insulating layer,
wherein the gate electrodes adjacent to the division region comprise portion that extends downward toward the device isolation layer.

15. A method of manufacturing a semiconductor device, the method comprising:
forming a first active region by performing a first patterning process, the first active region including active layers and sacrificial layers alternately staked;
performing a second patterning process on a substrate to form a first trench defining a division region extending in a first direction, and the division region divides the first active region into first and second active patterns;
forming a device isolation layer filling the first trench on the division region;
forming sacrificial patterns and gate spacers extending in the first direction on the first active region;
forming first recesses in an upper portion of the first active region using the sacrificial patterns and the gate spacers as a mask;
forming a first channel pattern on the first active pattern and a second channel pattern on the second active pattern;
forming first source/drain patterns in the first recesses;
forming a first interlayer insulating layer covering the first source/drain patterns and the gate spacers, the first interlayer insulating layer on the division region extends downward toward the device isolation layer filling the first trench on the division region;
removing the sacrificial pattern and the sacrificial layers; and
sequentially forming a gate insulating layer and gate electrodes on the first and second channel patterns,
wherein the first and second active patterns are spaced apart in a second direction, and the second direction is perpendicular to the first direction,
an end portion of the first active pattern adjacent to the device isolation layer comprises a protruding portion extending in the first direction, and
when viewed in a plan view, the protruding portion has a triangle shape, and a portion of the second active pattern adjacent to the device isolation layer has a square or rectangular shape.

16. The method of claim 15, wherein
the gate electrodes include dummy gate electrodes adjacent to the division region, and
the dummy gate electrodes include portions extending downward the device isolation layer filling the first trench.

17. The method of claim 15, wherein the protruding portion includes a hypotenuse that is inclined at an obtuse angle relative to a side of the first source/drain patterns crossing the first channel pattern.

18. The method of claim 15, wherein the protruding portion is spaced apart from the first source/drain patterns.

19. The method of claim 15, wherein
the first active pattern has a first side surface defined by the first trench,
the first channel pattern has a second side surface defined by the first trench, and
the first side surface and the second side surface are vertically aligned to each other.

20. The method of claim 15, wherein a width of the protruding portion in the first direction gradually increases in the second direction.

* * * * *